(12) United States Patent
Sarkar et al.

(10) Patent No.: US 11,424,118 B2
(45) Date of Patent: Aug. 23, 2022

(54) ELECTRONIC DEVICES COMPRISING SILICON CARBIDE MATERIALS

(71) Applicant: Micron Technology, Inc., Boise, ID (US)

(72) Inventors: Santanu Sarkar, Boise, ID (US); Farrell M. Good, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/751,049

(22) Filed: Jan. 23, 2020

(65) Prior Publication Data

US 2021/0233768 A1    Jul. 29, 2021

(51) Int. Cl.
| | | |
|---|---|---|
| *H01L 21/02* | (2006.01) | |
| *C23C 16/452* | (2006.01) | |
| *C23C 16/04* | (2006.01) | |
| *C01B 32/00* | (2017.01) | |
| *C01B 33/00* | (2006.01) | |

(52) U.S. Cl.
CPC ........ *H01L 21/02167* (2013.01); *C01B 32/00* (2017.08); *C01B 33/00* (2013.01); *C23C 16/045* (2013.01); *C23C 16/452* (2013.01); *H01L 21/02274* (2013.01); *H01L 21/02381* (2013.01); *H01L 2221/1047* (2013.01)

(58) Field of Classification Search
None
See application file for complete search history.

(56) References Cited

U.S. PATENT DOCUMENTS

| | | |
|---|---|---|
| 9,234,276 B2 | 1/2016 | Varadarajan |
| 9,281,471 B2 | 3/2016 | Hu et al. |
| 9,401,474 B2 | 7/2016 | Kim et al. |
| 9,577,010 B2 | 2/2017 | Sciarrillo |
| 10,147,875 B1 | 12/2018 | Hansen et al. |
| 10,158,000 B2 | 12/2018 | Lee et al. |

(Continued)

FOREIGN PATENT DOCUMENTS

| | | |
|---|---|---|
| CN | 109427972 A | 3/2019 |
| JP | 2007-134039 A | 5/2007 |

(Continued)

OTHER PUBLICATIONS

International Search Report for Application No. PCT/US2021/012943, dated May 6, 2021, 4 pages.

(Continued)

*Primary Examiner* — Jeffrey D Washville
(74) *Attorney, Agent, or Firm* — TraskBritt

(57) ABSTRACT

An electronic device comprising a stack structure comprising one or more stacks of materials and one or more silicon carbide materials adjacent to the one or more stacks of materials. The materials of the one or more stacks comprise a single chalcogenide material and one or more of a conductive carbon material, a conductive material, and a hardmask material. The one or more silicon carbide materials comprises silicon carbide, silicon carboxide, silicon carbonitride, silicon carboxynitride, and also comprise silicon-carbon covalent bonds. The one or more silicon carbide materials is configured as a liner or as a seal. Additional electronic devices are disclosed, as are related systems and methods of forming an electronic device.

19 Claims, 11 Drawing Sheets

(56) References Cited

U.S. PATENT DOCUMENTS

| | | | |
|---|---|---|---|
| 10,211,310 B2 | 2/2019 | Varadarajan | |
| 10,249,819 B2 | 4/2019 | Campbell et al. | |
| 10,325,773 B2 | 6/2019 | Varadarajan et al. | |
| 2009/0017563 A1 | 1/2009 | Jiang et al. | |
| 2016/0005966 A1 | 1/2016 | Kim et al. | |
| 2018/0114903 A1* | 4/2018 | Hausmann | H01L 45/1233 |
| 2018/0158947 A1 | 6/2018 | Yeh et al. | |
| 2018/0175161 A1 | 6/2018 | Wild et al. | |
| 2018/0330945 A1 | 11/2018 | Varaarajan et al. | |
| 2018/0366645 A1 | 12/2018 | Campbell et al. | |
| 2018/0374900 A1* | 12/2018 | Pellizzer | H01L 27/2427 |
| 2020/0006431 A1 | 1/2020 | Mayuzumi et al. | |
| 2020/0006652 A1* | 1/2020 | Cheng | H01L 45/14 |

FOREIGN PATENT DOCUMENTS

| | | |
|---|---|---|
| KR | 10-2016-0074594 A | 6/2016 |
| TW | 201715609 A | 5/2017 |

OTHER PUBLICATIONS

Written Opinion of the International Searching Authority for Application No. PCT/US2021/012943, dated May 6, 2021, 4 pages.

Taiwanese First Office Action for Application No. 110100356, dated Aug. 4, 2021, 24 pages.

Chen et al., "The Affinity of Si—N and Si—C Bonding in Amorphous Silicon Carbon Nitride (a-SiCN) Thin Film", Diamond and Related Materials, 14, (2005), pp. 1126-1130.

\* cited by examiner

ELECTRONIC DEVICES COMPRISING SILICON CARBIDE MATERIALS

TECHNICAL FIELD

Embodiments disclosed herein relate to electronic devices and electronic device fabrication. More particularly, embodiments of the disclosure relate to electronic devices comprising one or more silicon carbide materials and to related methods and systems.

BACKGROUND

Electronic device (e.g., semiconductor device, memory device) designers often desire to increase the level of integration or density of features (e.g., components) within an electronic device by reducing the dimensions of the individual features and by reducing the separation distance between neighboring features. Electronic device designers also desire to design architectures that are not only compact, but offer performance advantages, as well as simplified designs. Reducing the dimensions and spacing of features has placed increasing demands on the methods used to form the electronic devices. One solution has been to form three-dimensional (3D) electronic devices, such as 3D cross-point memory devices, in which the features are arranged vertically rather than horizontally. To form the features, multiple materials are positioned over one another and are etched to form stacks of the materials. The materials of the stacks include chalcogenide materials and electrode materials. Some of the materials of the stacks are sensitive to subsequently conducted process acts, such as to process temperatures or etch conditions of the subsequent process acts. The materials of the stacks may, for example, be thermally sensitive or sensitive to etch chemistries and other process conditions.

To protect the materials of the stacks during formation of the electronic device, a liner is formed over the stacks. In conventional electronic devices, the liner includes a layer of silicon nitride (SiN) and a layer of silicon oxide ($SiO_x$). However, the liner may not provide sufficient protection when aggressive etch chemistries are used to form the electronic device. In addition, process conditions used to form the silicon oxide on the silicon nitride may damage the silicon nitride of the liner. The layer of silicon oxide is formed on the layer of silicon nitride by an oxygen plasma-based process, such as a PEALD process, which damages (e.g., oxidizes) the layer of silicon nitride.

To further protect the materials of the stacks, a seal may be formed over the stacks, such as over the liner of the stacks. In conventional electronic devices, the seal includes silicon nitride in combination with silicon oxide. However, the seal may not uniformly cover sidewalls of the liner to sufficiently protect the materials of the stacks.

As aspect ratios of features continue to increase and the spacing between adjacent stacks continues to decrease with increasing memory density, the materials of the liner and/or of the seal may form a bottleneck or pinch off, causing a so-called "bread loafing" effect between upper portions of the adjacent stacks. If, however, the materials of the liner and/or of the seal are formed at a lower thickness, the liner and/or of the seal may not provide the desired protective properties. When a dielectric material is subsequently formed between the adjacent stacks, any bottlenecked portion of the liner and/or of the seal prevents the dielectric material from completely filling openings between the stacks and forms voids in the dielectric material.

DETAILED DESCRIPTION

Figure 1:
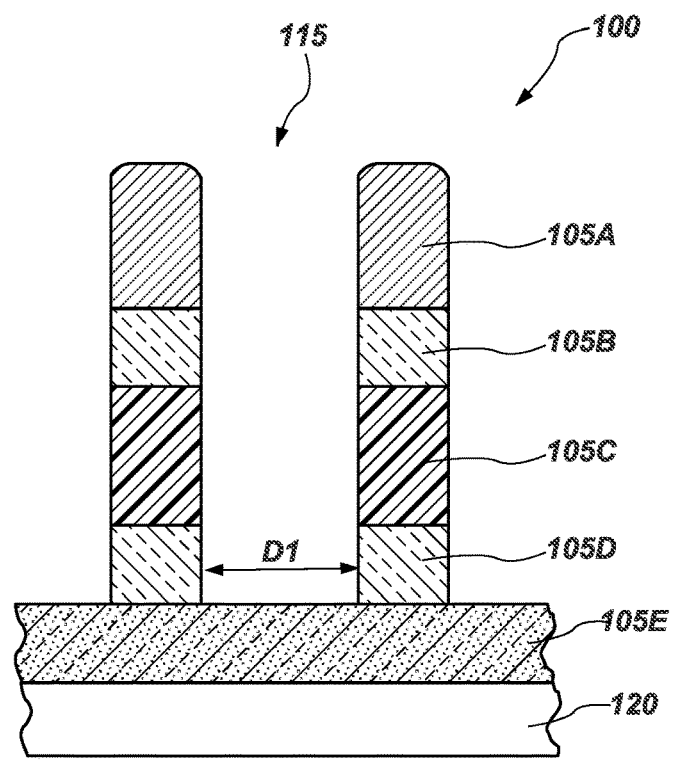
FIGS. 1-4 are cross-sectional views of stack structures including a liner containing a silicon carbide material at various stages of forming the stack structures according to embodiments of the disclosure.

An electronic device (e.g., an apparatus, a semiconductor device, a memory device) that includes a liner adjacent to (e.g., over) one or more stacks of materials is disclosed. The liner includes a material containing silicon atoms and carbon atoms (e.g., a silicon carbide material). The stacks include one or more thermally sensitive materials and/or one or more oxidation sensitive materials, and the silicon carbide material of the liner is formed over the materials of the stacks to protect the sensitive materials during subsequent process acts. The silicon carbide material of the liner is conformally formed over the stacks using a low temperature, non-oxidative process that does not substantially affect (e.g., damage) the materials of the stacks or other exposed materials of the electronic device. A seal containing the same or a different silicon carbide material may, optionally, be formed over the liner containing the silicon carbide material. The silicon carbide material of the liner and/or of the seal is formed by a radical chemical vapor deposition (CVD) process using a silicon-carbon precursor. After formation, the amount of carbon in the silicon carbide material may be tailored (e.g., tuned) depending on desired properties (e.g., etch rate, etch resistance, degree of conformality, etc.) of the silicon carbide material of the liner and/or of the seal. By conducting a treatment act on the silicon carbide material as initially formed, the carbon content of the silicon carbide material in the electronic device may be tailored to provide the desired properties.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of an electronic device or a complete process flow for manufacturing the electronic device and the structures described below do not form a complete electronic device. Only those process acts and structures necessary to understand the embodiments described herein are described in detail below. Additional acts to form a complete electronic device may be performed by conventional techniques.

Unless otherwise indicated, the materials described herein may be formed by conventional techniques including, but not limited to, spin coating, blanket coating, chemical vapor deposition (CVD), atomic layer deposition (ALD), plasma enhanced ALD, physical vapor deposition (PVD) (including sputtering, evaporation, ionized PVD, and/or plasma-enhanced CVD), or epitaxial growth. Alternatively, the materials may be grown in situ. Depending on the specific material to be formed, the technique for depositing or growing the material may be selected by a person of ordinary skill in the art. The removal of materials may be accomplished by any suitable technique including, but not limited to, etching (e.g., dry etching, wet etching, vapor etching), ion milling, abrasive planarization (e.g., chemical-mechanical planarization), or other known methods unless the context indicates otherwise.

Drawings presented herein are for illustrative purposes only, and are not meant to be actual views of any particular material, component, structure, electronic device, or electronic system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "configured" refers to a size, shape, material composition, and arrangement of one or more of at least one structure and at least one apparatus facilitating operation of one or more of the structure and the apparatus in a pre-determined way.

As used herein, the term "electronic device" includes, without limitation, a memory device, as well as semiconductor devices which may or may not incorporate memory, such as a logic device, a processor device, or a radiofrequency (RF) device. Further, an electronic device may incorporate memory in addition to other functions such as, for example, a so-called "system on a chip" (SoC) including a processor and memory, or an electronic device including logic and memory. The electronic device may be a 3D electronic device, such as a 3D crosspoint memory device, that includes sensitive materials.

As used herein, the term "liner material" or "liner" means and includes a silicon carbide material formulated to exhibit etch selectivity between the silicon carbide material and other exposed materials when subjected to the same etch conditions. The liner may include one or more materials, such as the silicon carbide material and one or more other materials, positioned adjacent to one another and that are formulated to exhibit the desired etch selectivity properties. A thickness of the liner is less than a thickness of the seal.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, no intervening elements are present.

As used herein, the term "seal material" or "seal" means and includes a silicon carbide material formulated to exhibit barrier properties, such as reducing or substantially preventing water from passing through the material. The seal may include one or more materials, such as the silicon carbide material and one or more other materials, positioned adjacent to one another and that are formulated to exhibit the desired barrier properties. The thickness of the seal is greater than the thickness of the liner.

As used herein, the term "silicon carbide material" means and includes a material including silicon atoms and carbon atoms. The silicon carbide material may optionally include one or more of oxygen atoms, nitrogen atoms, or boron atoms. The silicon carbide material may include, but is not limited to, silicon carbide, silicon carboxide, silicon carbonitride, silicon carboxynitride, or silicon boronitrocarbide. The silicon carbide material may be a stoichiometric compound or a non-stoichiometric compound. The terms "silicon carboxide" or "oxygen doped silicon carbide" are used to refer to the silicon carbide material having a general chemical formula of $SiCO_x$, the terms "silicon carbonitride" or "nitrogen doped silicon carbide" are used to refer to the silicon carbide material having a general chemical formula of $SiCN_y$, and the terms "silicon carboxynitride" or "oxygen and nitrogen doped silicon carbide" are used to refer to the silicon carbide material having a general chemical formula of $SiCO_xN_y$. The term "silicon carbide material" is used to collectively refer to one or more of silicon carbide, the silicon carbonitride, the silicon carboxide, or the silicon carboxynitride. Silicon oxide ($SiO_x$) including only silicon atoms and oxygen atoms is excluded from the definition of a silicon carbide material.

As used herein, the term "selectively etchable" means and includes a material that exhibits a greater etch rate responsive to exposure to a given etch chemistry and/or process conditions relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

As used herein, the term "stack" means and includes a feature having multiple materials positioned vertically adjacent to one another. At least one of the materials of the stack may be sensitive to heat and/or to water. The materials of the stacks may include one or more conductive (e.g., electrically conductive) material, one or more chalcogenide material, and a hardmask material, or a combination thereof.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "substrate" means and includes a material (e.g., a base material) or construction upon which additional materials are formed. The substrate may be a an electronic substrate, a semiconductor substrate, a base semiconductor layer on a supporting structure, an electrode, an electronic substrate having one or more materials, layers, structures, or regions formed thereon, or a semiconductor substrate having one or more materials, layers, structures, or regions formed thereon. The materials on the electronic substrate or semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

Figure 2:
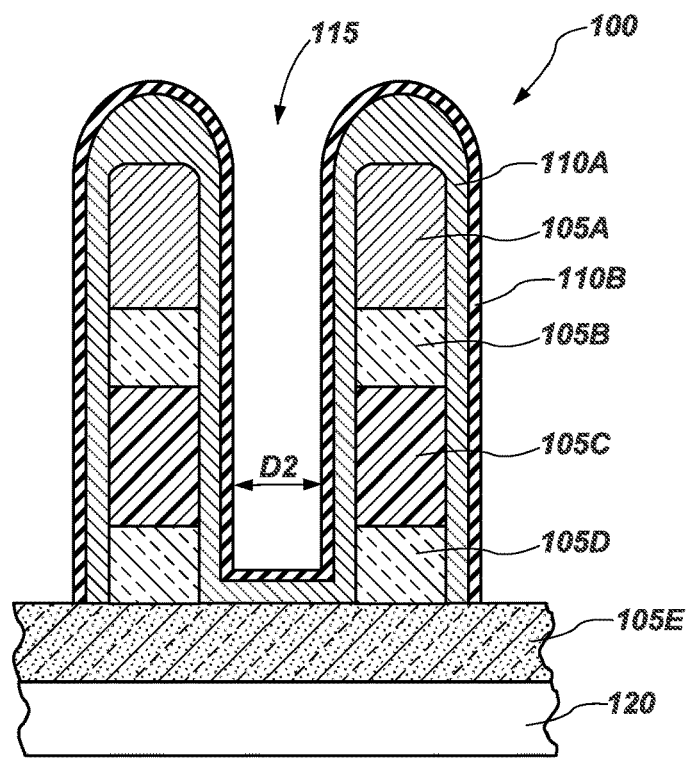

Stack structures 100 including stacks 105, liner 110 adjacent to (e.g., vertically adjacent to, over) the stacks 105, and openings 115 are shown in FIGS. 1 and 2. The liner 110 may include one or more liner portions, such as liner portions 110A, 110B. The stack structure 100 is formed adjacent to (e.g., vertically adjacent to, over) a substrate 120. The stacks 105 are separated from one another by the openings 115, and adjacent stacks 105 are separated from one another by a distance D1. The distance D1 may depend on a pitch at which the stacks 105 of the stack structure 100 are formed, which is selected depending on the intended use of the stack structure 100 in an electronic device containing the stack structure 100. Each stack 105 includes multiple materials, such as one or more conductive materials, one or more chalcogenide materials, and a hardmask material. As described in more detail below, the stack structure 100 may be present in memory cells of the electronic device.

FIGS. 1 and 2 show the stacks 105 as including four materials 105A-105D and conductive material 105E. However, the number of materials in the stacks 105 may be more than or less than five. One or more of the materials of the stacks 105 may be heat sensitive or sensitive to oxidation. The stacks 105 may, for instance, include the conductive material 105E, one or more chalcogenide materials, one or more conductive carbon materials, one or more conductive materials in addition to the conductive material 105E, and the hardmask material. By way of example only, the stacks 105 may include the conductive material 105E over the substrate 120, a first conductive carbon material over the conductive material 105E, one or more chalcogenide materials over the first conductive carbon material, a second conductive carbon material over the one or more chalcogenide materials, and the hardmask material over the second conductive carbon material. The stacks 105 may, for example, include one or more chalcogenide materials and one or more conductive carbon materials, which are sensitive to heat or to oxidation (e.g., oxidative conditions), to which conditions the materials may be exposed during and following the formation of the stacks 105 or during formation of the liner 110 or a seal 125 (see FIG. 5). In some embodiments, the stacks 105 include the conductive material 105E over the substrate 120, the first conductive carbon material over the conductive material 105E, a chalcogenide material over the first conductive carbon material, a second conductive carbon material over the chalcogenide material, and the hardmask material over the second conductive carbon material. In other embodiments, the stacks 105 include the conductive material 105E over the substrate 120, the first conductive carbon material over the conductive material 105E, a first chalcogenide material over the first conductive carbon material, a second chalcogenide material over the first chalcogenide material, a second conductive carbon material over the second chalcogenide material, and the hardmask material over the second conductive carbon material.

The conductive material 105E of the stacks 105 may include an electrically conductive material including, but not limited to, tungsten, aluminum, copper, titanium, tantalum, platinum, alloys thereof, heavily doped semiconductor material, polysilicon, a conductive silicide, a conductive nitride, a conductive carbon, a conductive carbide, or combinations thereof. The conductive material 105E may, for example, be configured as an access line, a word line, a contact, a digit line, a bit line, etc. In some such embodiments, the conductive material 105E is tungsten. The conductive material 105E may alternatively be configured as an electrode. In some such embodiments, the conductive material 105E is conductive carbon.

The conductive carbon materials of the stacks 105 may include, but are not limited to, an electrically conductive carbon material.

The chalcogenide material of the stacks 105 may be a chalcogenide glass, a chalcogenide-metal ion glass, or other chalcogenide-containing material. The chalcogenide material may be a binary or multinary (ternary, quaternary, etc.) compound including at least one chalcogenide atom and at least one more electropositive element. As used herein, the term "chalcogenide" means and includes an element of Group VI of the Periodic Table, such as oxygen (O), sulfur (S), selenium (Se), or tellurium (Te). The electropositive element may include, but is not necessarily limited to, nitrogen (N), silicon (Si), nickel (Ni), gallium (Ga), germanium (Ge), arsenic (As), silver (Ag), indium (In), tin (Sn), antimony (Sb), gold (Au), lead (Pb), bismuth (Bi), or combinations thereof. By way of example only, the chalcogenide material may include a compound including Ge, Sb, and Te (i.e., a GST compound), such as $Ge_2Sb_2Te_5$, however, the disclosure is not so limited and the chalcogenide material may include other compounds including at least one chalcogenide element. The chalcogenide material may be doped or undoped and may have metal ions mixed therein. By way of example only, the chalcogenide material may be an alloy including indium, selenium, tellurium, antimony, arsenic, bismuth, germanium, oxygen, tin, or combinations thereof. In some embodiments, the stack 105 includes one (e.g., a single) chalcogenide material. In other embodiments, the stack 105 includes two chalcogenide materials. The two chalcogenide materials may be adjacent to one another or may be spaced apart by one or more of the other materials of the stacks 105.

The hardmask material of the stacks 105 may exhibit a different etch selectivity relative to other materials in the stacks 105 and relative to one or more other conductive materials formed on the stacks 105 during subsequent process acts. The hardmask material may include, but is not limited to, silicon nitride or amorphous carbon. The hardmask material may optionally be removed before conducting subsequent process acts. In some embodiments, the hardmask material is silicon nitride.

Figure 3:
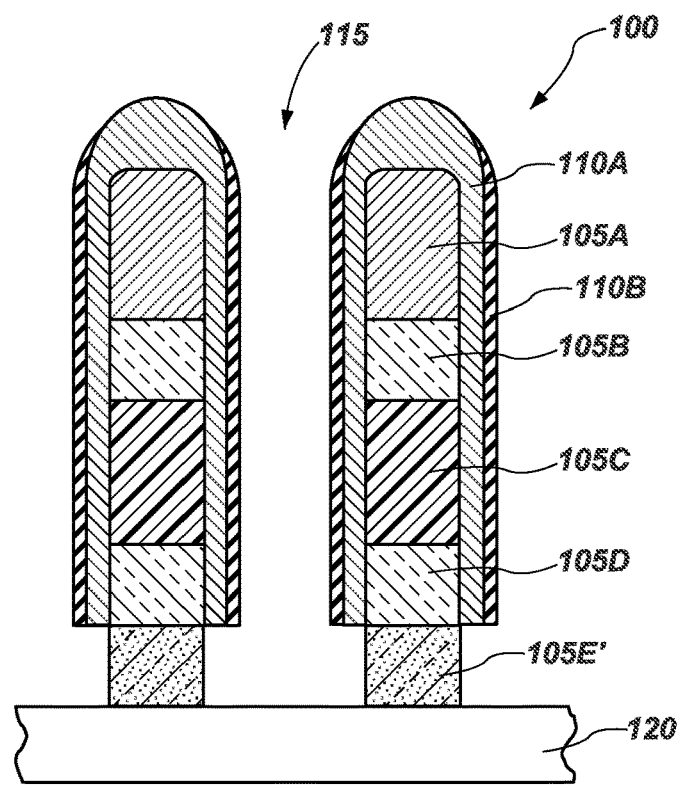

The materials of the stacks 105 are positioned adjacent to (e.g., vertically adjacent to) one another. The materials of the stacks 105 may be formed vertically adjacent to one another by conventional techniques and the materials patterned to form the stacks 105 separated from one another by the openings 115. The materials may be patterned (e.g., a portion of the materials removed) by conventional techniques, such as by etching the materials using conventional photolithography and etching techniques. The materials may, for example, be exposed to an anisotropic etch process, such as a dry plasma etch process or a reactive ion etch process, to form the stacks 105. Conventional etch chemistries and etch conditions may be used to form the stacks 105 and the openings 115. The resulting stacks 105 may be high aspect ratio (HAR) features having an aspect ratio (i.e., a ratio of width to depth) of greater than or equal to about 5:1, such as from about 5:1 to about 100:1, from about 5:1 to about 50:1, from about 10:1 to about 40:1, from about 10:1 to about 30:1, from about 10:1 to about 20:1, from about 20:1 to about 50:1, from about 20:1 to about 40:1, or from about 20:1 to about 30:1. The openings 115 may also exhibit a high aspect ratio. The stacks 105 may be formed at a half pitch of from about 3 nm to about 100 nm, such as from about 10 nm to about 30 nm, from about 15 nm to about 25 nm or from about from about 15 nm to about 20 nm. In some embodiments, the stacks 105 are formed at a half pitch of 20 nm. In other embodiments, the stacks 105 are formed at a half pitch of 14 nm. In addition to the stacks 105 being configured as lines, other geometries, such as pillars, may be used. The conductive material 105E of the stacks 105 may be patterned at the same time as the other materials of the stacks 105 or may be patterned after patterning the materials 105A-105D, as shown in FIG. 3.

The liner 110A, 110B may be formed adjacent to (e.g., over) the stacks 105, as shown in FIG. 2. While the drawings illustrate the liner 110 as including two liner portions 110A, 110B, the liner 110 may include a single liner portion 110B or may include three or more portions depending on the degree of protection to be achieved. The liner 110A, 110B is conformally formed on sidewalls of the materials 105A-105D of the stacks 105 at a thickness sufficient to protect the materials 105A-105D of the stacks 105 during process acts conducted during or after the formation of the stacks 105 or before or after the optional seal 125 (see FIG. 5) is formed adjacent to (e.g., over) the liner 110A, 110B. The subsequent process acts may include, but are not limited to, an etch process (e.g., a dry etch process, a wet etch process) or a plasma-based process, such as a treatment process or a densification process. The liner 110A, 110B may also protect the materials of the stacks 105 during process acts conducted to clean the stacks 105. The liner 110A, 110B is also formed on horizontal surfaces of the conductive material 105E to protect the conductive material 105E.

As shown in FIG. 2, adjacent stacks 105 of the stack structure 100 are separated from one another by a distance D2 that is less than the distance D1. The distance D2 may range from about 3 nm to about 300 nm, such as from about 20 nm to about 60 nm, from about 20 nm to about 40 nm, or from about 40 nm to about 60 nm depending on a pitch at which the stacks 105 of the stack structure 100 are formed and a thickness of the liner 110A, 110B. The distance D2 between adjacent stacks 105 may be equal to the thickness D1 minus two times the thickness of the liner 110, 110B.

The liner 110A is formed of a dielectric material, such as silicon nitride (SiN). The liner 110A may be conformally formed over the stacks 105 by conventional techniques, such as by PECVD. The liner 110A may provide adhesion properties or protective properties to the liner 110. The liner portion 110A has a thickness from about 10 Å to about 60 Å. The liner 110B may be conformally formed over the liner 110A, such as forming the liner 110B directly over (e.g., in contact with) the liner 110A. Alternatively, the liner 110 may include only the silicon carbide material of the liner portion 110B, where the silicon carbide material of the liner 110B is directly over (e.g., in contact with) the stacks 105. For instance, as the spacing between adjacent stacks 105 of the stack structure 100 decreases, the silicon carbide material may be formed directly on the stacks 105 such that only the liner 110B is present.

The liner 110B may be formed of the silicon carbide material. The liner 110B is formed by a radical CVD process that utilizes one (e.g., a single) silicon-carbon precursor that includes covalent bonds between silicon atoms and carbon atoms of the silicon-carbon precursor. The resulting silicon carbide material, therefore, includes covalent bonds between the silicon atoms and the carbon atoms and is more stable (e.g., thermodynamically stable) than conventional silicon carbide materials formed by other processes. The silicon carbide material of the liner 110B, as initially formed, may include between about 2 atomic percent (at. %) and about 50 at. % carbon, such as between about 2 at. % and about 40 at. % carbon, between about 2 at. % and about 30 at. % carbon, between about 5 at. % and about 50 at. % carbon, between about 5 at. % and about 40 at. % carbon, between about 5 at. % and about 30 at. % carbon, between about between about 10 at. % and about 50 at. % carbon, between about 15 at. % and about 50 at. % carbon, between about 20 at. % and about 50 at. % carbon, between about 25 at. % and about 50 at. % carbon, between about 30 at. % and about 50 at. % carbon, between about 35 at. % and about 50 at. % carbon, between about 40 at. % and about 50 at. % carbon, between about 45 at. % to about 50 at. % carbon, between about 10 at. % and about 30 at. % carbon, between about 15 at. % and about 30 at. % carbon, between about 20 at. % and about 30 at. % carbon, between about 25 at. % and about 30 at. % carbon, between about 30 at. % and about 50 at. % carbon, between about 35 at. % and about 50 at. % carbon, between about 40 at. % and about 50 at. % carbon, between about 35 at. % and about 45 at. % carbon, or between about 10 at. % and about 25 at. % carbon. The radical CVD process may be a non-oxidative process that does not affect (e.g., damage) the liner 110B. The silicon carbide material of the liner 110B may exhibit a high degree of conformality and exhibit a high resistance to etch chemistries used in subsequent process acts. The liner portion 110B has a thickness from about 10 Å to about 60 Å.

To form the liner 110B, the stack structure 100 including the stacks 105 and liner 110A may be placed into a reaction chamber and the silicon carbide material of the liner 110B may be formed by the radical CVD process. The reaction chamber may be conventional equipment used in the semiconductor industry. The silicon-carbon precursor, radical species, and optional carrier gas are introduced to the reaction chamber containing the stack structure 100. The silicon-carbon precursor may contain one or more silicon-carbon (Si—C) covalent bonds between the silicon atoms and the carbon atoms of the silicon-carbon precursor. The silicon-carbon precursor may also contain one or more silicon-hydrogen (Si—H) covalent bonds and/or one or more silicon-silicon (Si—Si) covalent bonds. The silicon-carbon precursor may be a gas at a temperature at which the silicon carbide material of the liner 110B is formed. By using the silicon-carbon precursor including the silicon-carbon covalent bonds, the silicon carbide material of the liner 110B, which also includes silicon-carbon covalent bonds, may be formed at a low temperature and using less aggressive process conditions since forming Si—C covalent bonds is thermodynamically not favored. The silicon-carbon precursor may include between about 2 at. % and about 45 at. % silicon, between about 2 at. % and about 50 at. % carbon, between about 0 at. % and about 45 at. % oxygen, and between about 0 at. % and about 45 at. % nitrogen.

Depending on a desired material composition of the silicon carbide material, the silicon-carbon precursor may optionally include covalent bonds between the silicon atoms and nitrogen atoms of the silicon-carbon precursor or covalent bonds between the silicon atoms and oxygen atoms of the silicon-carbon precursor in addition to the covalent bonds between the silicon atoms and carbon atoms. If, for example, the silicon carbide material includes oxygen, the silicon-carbon precursor may include the one or more silicon-hydrogen (Si—H) covalent bonds, the one or more Si—C covalent bonds, the one or more silicon-silicon (Si—Si) covalent bonds, and one or more silicon-oxygen (Si—O) covalent bonds. If, for example, the silicon carbide material includes nitrogen, the silicon-carbon precursor may include the one or more silicon-hydrogen (Si—H) covalent bonds, the one or more Si—C covalent bonds, the one or more silicon-silicon (Si—Si) covalent bonds, and one or more silicon-nitrogen (Si—N) covalent bonds. If, for example, the silicon carbide material includes oxygen and nitrogen, the silicon-carbon precursor may include the one or more silicon-hydrogen (Si—H) covalent bonds, the one or more Si—C covalent bonds, the one or more silicon-silicon (Si—Si) covalent bonds, one or more silicon-nitrogen (Si—N) covalent bonds, and one or more silicon-oxygen (Si—O) covalent bonds. The silicon-carbon precursor may be a linear siloxane, a cyclic siloxane, a monosilane, an alkyl silane, an alkoxy silane, or a silazane. Alternatively, the silicon-carbon precursor may have a general chemical formula of Si—R, where R is an alkyl group; Si—Ar, where Ar is an aryl group; or Si—OR or Si—OAr. Such silicon-carbon precursors are known in the art and may be commercially available from numerous sources, such as from LAM Research Corp. (Fremont, Calif.). A single type of silicon-carbon precursor may be used to form the silicon carbide material by appropriately selecting the silicon-carbon precursor to contain the covalent bonds (e.g., Si—C covalent bonds, Si—Si covalent bonds, Si—O covalent bonds, Si—N covalent bonds) to be present in the resulting silicon carbide material. In other words, the Si—C covalent bonds, Si—Si covalent bonds, Si—O covalent bonds, Si—N covalent bonds are formed (e.g., present) in the silicon-carbon precursor before radical species are formed.

The radical species may, for example, include hydrogen radicals (H'), oxygen radical species, or nitrogen radical species. The hydrogen radicals may be generated by conventional techniques, such as subjecting hydrogen gas ($H_2$) to a plasma in a remote plasma source. The generation of the hydrogen radicals from the hydrogen gas is conventional and is not described in detail herein. The plasma source may include, but is not limited to, a capacitively coupled plasma (CCP), an inductively coupled plasma (ICP), a microwave (MW) plasma, a DC plasma, or a laser-created plasma. The hydrogen radicals are generated at a high pressure using a high powered, remote ICP source. When reacted with the silicon-carbon precursor, the hydrogen radicals may be in a sufficiently low energy state that the Si—C covalent bonds in the silicon-carbon precursor do not react with (e.g., are not broken by) the hydrogen radicals during the formation of the silicon carbide material on the stacks 105. The hydrogen radicals may initially be in an excited energy state, which relaxes to low energy state hydrogen radicals (e.g., ground energy state hydrogen radicals). The silicon carbon precursor and the hydrogen radicals may be sufficiently reactive with one another that plasma conditions are not used to form the silicon carbide material of the liner 110B. The low energy state hydrogen radicals may react with the silicon-carbon precursor to break Si—Si covalent bonds and/or Si—H covalent bonds, activating the silicon-carbon precursor and forming radicals of the silicon-carbon precursor. The activated silicon-carbon precursor includes reactive sites and the hydrogen radicals initiate crosslinking at the reactive sites of the silicon-carbon precursor such that molecules of the activated silicon-carbon precursor react with one another to form the silicon carbide material of the liner 110B. Radicals of the activated silicon-carbon precursor may exhibit a low sticking coefficient. Since an oxidation reaction environment is not used in the radical based reactions, the silicon carbide material is able to be formed by the radical CVD process with low residence time reactions and at a low temperature. Substantially all of the hydrogen radicals may be in the low energy state or in the ground state and may react with the silicon-carbon precursor. By way of example only, greater than about 90% or greater than about 95% of the hydrogen radicals may be in the low energy state or the ground state. Therefore, the stack structure 100 including the stacks 105 and liner 110A is exposed to a high density of the hydrogen radicals.

If the silicon-carbon precursor also includes Si—O covalent bonds, the hydrogen radicals may be in a sufficiently low energy state that the Si—C covalent bonds and the Si—O covalent bonds do not react with (e.g., are not broken by) the hydrogen radicals during the formation of the silicon carbide material. If the silicon-carbon precursor also includes Si—N covalent bonds, the hydrogen radicals may be in a sufficiently low energy state that the Si—C covalent bonds and the Si—N covalent bonds do not react with (e.g., are not broken by) the hydrogen radicals during the formation of the silicon carbide material. If the silicon-carbon precursor also includes Si—O covalent bonds and Si—N covalent bonds, the hydrogen radicals may be in a sufficiently low energy state that the Si—C covalent bonds, the Si—O covalent bonds, and the Si—N covalent bonds do not react with (e.g., are not broken by) the hydrogen radicals during the formation of the silicon carbide material.

The low energy state hydrogen radicals react with the silicon-carbon precursor to form the silicon carbide material on the stacks 105, such as on the sidewalls of the materials of the stacks 105. The process conditions are selected such that the Si—Si covalent bonds and the Si—H covalent bonds in the silicon-carbon precursor are selectively broken while the Si—C covalent bonds and the Si—O covalent bonds and/or the Si—N covalent bonds are not broken. The Si—C bonds in the silicon-carbon precursor, and the Si—O covalent bonds and/or the Si—N covalent bonds if present, are thermodynamically stable under the process conditions of the radical CVD process relative to the Si—Si covalent bonds and the Si—H covalent bonds in the silicon-carbon precursor. The silicon and carbon of the silicon-carbon precursor contribute to substantially all of the silicon and carbon in the silicon carbide material as initially formed. If the silicon-carbon precursor includes one or more of oxygen and nitrogen, the silicon-carbon precursor contributes substantially all of the oxygen and nitrogen of the silicon carbide material as initially formed.

The process conditions of the radical CVD process substantially preserve the Si—C covalent bonds of the silicon-carbon precursor. In other words, the Si—C covalent bonds are present in the silicon carbide material after reacting the silicon-carbon precursor and the low energy state hydrogen radicals. If the silicon carbide material is a silicon carboxide, the Si—C covalent bonds and the Si—O covalent bonds may be present in the silicon carbide material. If the silicon carbide material is a silicon carbonitride, the Si—C covalent bonds and the Si—N covalent bonds may be present in the silicon carbide material. If the silicon carbide material is a silicon carboxynitride, the Si—C covalent bonds, the Si—O covalent bonds, and the Si—N covalent bonds may be present in the silicon carbide material. The reactive species and the silicon-carbon precursor may be introduced into the reaction chamber at a sufficient flow rate, temperature, pressure, residence time, RF power, etc., to maintain the hydrogen radicals in the low energy state or the ground state. By way of example only, the temperature of the stack structure 100 within the reaction chamber may be from about 50° C. to about 500° C., such as from about 50° C. to about 450° C. The pressure within the reaction chamber may be less than or equal to about 35 TOM The silicon carbide material as formed may be a substantially homogeneous chemical composition or may be a heterogeneous chemical composition, such as including a gradient of carbon across a thickness of the silicon carbide material. By way of example only, the silicon carbide material may include a silicon-rich portion proximal to the stacks 105, with the carbon content of the silicon carbide material increasing distal to the stacks 105. Alternatively, the silicon carbide material may be a substantially homogenous composition across its thickness. The liner 110B may exhibit a step coverage of greater than or equal to about 75%, greater than or equal to about 80%, greater than or equal to about 85%, greater than or equal to about 90%, greater than or equal to about 95%, or greater than or equal to about 99%.

Forming the silicon carbide material of the liner 110B by the radical CVD process enables the silicon carbide material to be formed without using a direct plasma, which reduces plasma damage to the stack structure 100. Since the silicon-carbon precursor includes the desired covalent bonds, the silicon carbide material is able to be formed at a lower temperature and using only a single silicon-carbon precursor. Since forming Si—C covalent bonds is not thermodynamically favored at the process conditions of the radical CVD process, substantially the same covalent bonds existing in the silicon-carbon precursor are present in the silicon carbide material of the liner 110B. In addition, the low sticking coefficient of the radicals enables the silicon carbide material to be formed at a high step coverage, such as at a step coverage of greater than or equal to about 85%.

The silicon carbide material according to embodiments of the disclosure differs from a silicon carbide material formed using separate silicon precursors and carbon precursors as the source of silicon and carbon, respectively. The silicon carbide material formed by the radical CVD process includes Si—C covalent bonds while a silicon carbide material formed using separate silicon precursors and carbon precursors does not include Si—C covalent bonds. Similarly, the silicon carbide material formed by the radical CVD process includes Si—C covalent bonds, Si—O covalent bonds, and Si—N covalent bonds while a silicon carbide material formed using separate silicon precursors, carbon precursors, nitrogen precursors, and oxygen precursors does not include Si—C covalent bonds.

While embodiments herein describe the silicon carbide material as being formed by the radical CVD process, an atomic layer deposition (ALD) process, such as a plasma enhanced ALD process, may alternatively be used. By way of example only, the silicon carbide material may be formed using a plasma of $Si_2Cl_6$ and a plasma of $CH_4$ to form silicon carbide (SiC) or silicon carboxide ($SiCO_x$) following an $O_2$ plasma treatment. Silicon carboxynitride ($SiCO_xN_y$) may also be formed by ALD using a sequential flow of $Si_2Cl_6$ and $CH_3NH_2$ plasma.

The conductive material 105E of the stacks 105 may be patterned to form conductive material 105E', as shown in FIG. 3. The silicon carbide material of the liner 110B may be substantially resistant to a dry etch chemistry used to pattern the conductive material 105E after forming the liner 110A, 110B adjacent to (e.g., over) the stacks 105. However, portions of the liner 110 may be removed from the horizontal surfaces of the conductive material 105E and a portion of one or more of the liner 110A, 110B may be removed from top portions of the stacks 105. For instance, a portion of the liner 110A, 110B adjacent to (e.g., over) a top surface of the stacks 105 and adjacent to (e.g., over) the horizontal surfaces of the conductive material 105E may be removed, while a portion of the liner 110A, 110B remains on the sidewalls of the materials 105A-105D of the stacks 105. The etch chemistry and etch conditions may, for example, remove the liner 110B from the top of the stacks 105, such as over the hardmask, while the liner 110A, 110B remains on the sidewalls of the chalcogenide materials and/or the conductive carbon materials of the materials 105A-105E of the stacks 105. The conductive material 105E may be etched by the same etch chemistry and etch conditions, forming the conductive material 105E'. While FIG. 2 shows the liner 110A, 110B as being substantially continuous materials, the liner 110A, 110B may become discontinuous during the patterning of the conductive material 105E, as shown in FIGS. 3-7, due to the etch chemistry and etch conditions used.

The silicon carbide material of the liner 110B may also be substantially resistant to an aqueous hydrogen fluoride (HF) wet etch chemistry, such as that used to remove residues (e.g., clean) the stack structures 100 following the patterning of the conductive material 105E. The silicon carbide material of the liner 110B may also be substantially resistant to hydrogen peroxide, citric acid, or ammonium hydroxide wet etch chemistries.

Figure 4:
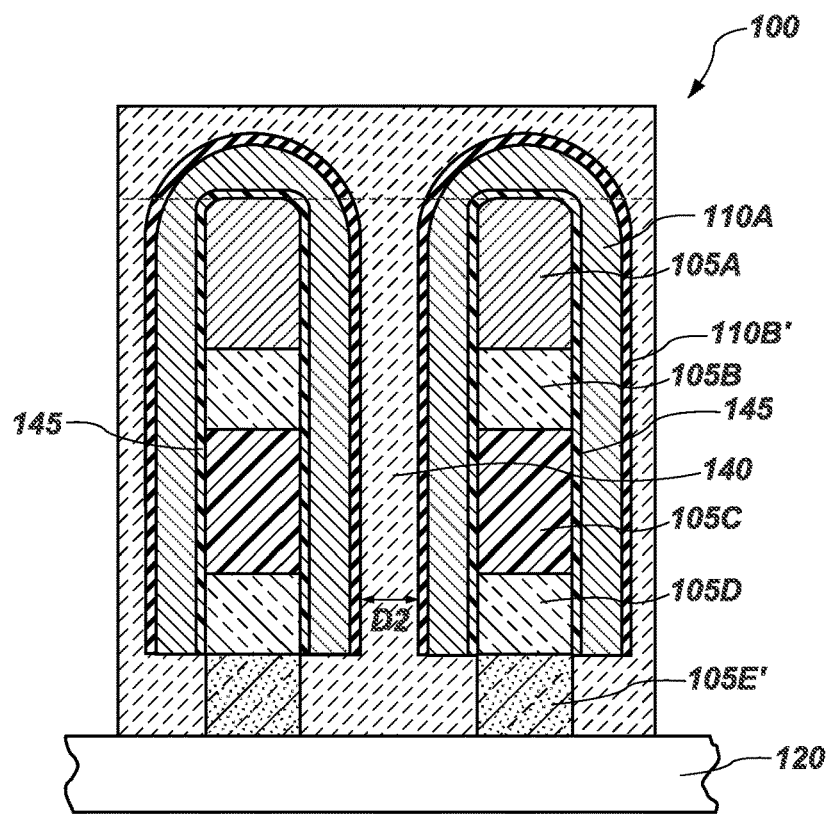

The liner 110B may be subjected to one or more treatment acts that change (e.g., reduce) the carbon content of the liner 110B, which changes (e.g., decreases) the dielectric constant of the liner 110B compared to the dielectric constant of the liner 110B as initially formed. After the treatment act, the liner 110B is referred to as the treated liner 110B' and is illustrated in FIG. 4 and subsequent drawings as liner 110B', indicating that the treatment act has been conducted. The dielectric constant of the silicon carbide material of the liner 110B may be lower than the dielectric constant (about 8) of silicon nitride. The lower dielectric constant of the silicon carbide material according to embodiments of the disclosure may enable the electronic device containing the silicon carbide material to mitigate high spike current due to the high capacitance of the silicon carbide material. The treatment act may also densify the liner 110B, increasing the density from about 1.8 $g/cm^3$ to about 2.0 $g/cm^3$. The treatment act may be conducted to tailor the carbon content of the treated liner 110B' and to provide the desired properties of the treated liner 110B'. The treatment act may include exposing the liner 110B to an oxygen gas ($O_2$) treatment act, such as an $O_2$ plasma treatment act. Without being bound by any theory, it is believed that oxygen atoms in the oxidizing environment of the oxygen plasma treatment react with the carbon in the silicon carbide material to form carbon dioxide, which is volatile. A portion of the carbon of the silicon carbide material may, therefore, be removed from the silicon carbide material following the oxygen plasma treatment act. The silicon carbide material of the treated liner 110B', therefore, includes less carbon than the carbon content of the initially formed silicon carbide material. To provide the desired etch selectivity during subsequent process acts, the silicon carbide material may contain at least a minimal amount of carbon following the oxygen plasma treatment act.

Process conditions, such as temperature, pressure, RF power, etc., of the oxygen treatment act may be chosen depending on the desired carbon content in the treated liner 110B'. The process conditions may be conventional. The treatment act (e.g., the oxygen treatment) may be conducted after forming the silicon carbide material of the liner 110B to a total desired thickness. Alternatively, the oxygen treatment may be conducted after forming an initial portion of the silicon carbide material, followed by forming one or more additional portions of the silicon carbide material, followed by additional oxygen treatment acts. To prevent damage to the silicon carbide material, the oxygen treatment may be initially conducted at a low oxidation rate, followed by increasing the oxidation rate after the silicon carbide material is formed to a sufficient thickness. Conducting multiple oxygen treatment acts may increase the density of the liner 110B compared to conducting a single oxygen treatment act. By way of example only, the density of the liner 110B may be increased from about 1.8 $g/cm^3$-1.9 $g/cm^3$ to about 2.0 $g/cm^3$ by doubling the number of oxygen treatment acts. The treated liner 110B' may include between about 2 at. % and about 50 at. % carbon depending on the treatment conditions used. If, for example, the formation of each silicon carbide material portion is followed by an oxygen plasma treatment, the silicon carbide material may include between about 2 at. % and about 5 at. % carbon. Conversely, if the silicon carbide material is formed to the total desired thickness, followed by single plasma oxygen treatment, the silicon carbide material may include more carbon, such as from about 15 at. % to about 50 at. % carbon.

The silicon carbide material of the treated liner 110B' differs from a silicon carbide material formed using separate silicon precursors and carbon precursors as the source of silicon and carbon, respectively, and exposed to a similar treatment act. The treated silicon carbide material formed by the radical CVD process includes Si—C covalent bonds while a treated silicon carbide material formed using separate silicon precursors and carbon precursors does not include Si—C covalent bonds.

The treatment act may include nitrogen gas ($N_2$), ammonia ($NH_3$), or hydrogen gas ($H_2$) in addition to the oxygen gas. The treatment act may also include a carrier gas (e.g., inert gas), such as helium. Since oxygen gas is used during the treatment act and is incorporated into the silicon carbide material, the silicon carbide material including oxygen may, nevertheless, be formed even if the silicon-carbon precursor did not include oxygen atoms. In other words, the source of oxygen in the silicon carbide material including oxygen may be from the oxygen gas used in the treatment act. Similarly, if the treatment act includes nitrogen gas, the source of nitrogen in the silicon carbide material including nitrogen may be from the nitrogen gas used in the treatment act. The treatment act may include nitrogen gas ($N_2$), ammonia ($NH_3$), or hydrogen gas ($H_2$) in addition to the oxygen gas.

As shown in FIG. 4, a fill material 140 may be formed in the openings 115. The distance D2 of the openings 115 may be sufficient for the fill material 140 to be formed in the openings 115 without forming voids in the fill material 140. The fill material 140 may, for example, be an electrically insulative material, such as a dielectric material. The fill material 140 may be a partially sacrificial material in that the fill material 140 is subsequently partially removed prior to completion of the electronic device that includes the stack structure 100. The fill material 140 may, for example, be partially removed prior to completion of a first deck of the electronic device. Alternatively, the fill material 140 may be present in the electronic device that includes the stack structure 100. The fill material 140 may, for example, be silicon dioxide, silicon nitride, silicon oxynitride, silicon oxycarbide, a spin-on dielectric material (SOD), BPSG, BSG, an air gap, or another dielectric material. The silicon carbide material according to embodiments of the disclosure may also be used as the fill material 140 such that the silicon carbide material substantially completely fills the openings 115. In some embodiments, the fill material 140 is a spin-on silicon dioxide. In other embodiments, the fill material 140 is a high quality, silicon dioxide. However, other fill materials 140 may be used, such as by forming an air gap between the adjacent stacks 105.

The fill material 140 may substantially completely fill the openings 115, as shown in FIG. 4. Excess fill material 140 over the stacks 105 may subsequently be removed, such as by chemical mechanical planarization (CMP). A portion of the liner 110 may also be removed, such as from upper surfaces of the stacks 105, exposing the hardmask material or an electrode material of the stacks 105, as shown by the dashed line in FIG. 4. However, the liner 110 remains on the sidewalls of the stacks 105. If the fill material 140 is a dielectric material, the dielectric material may isolate memory cells of the electronic device from one another and may also provide mechanical support during subsequent process acts to form the electronic device including the silicon carbide material.

Figure 5:
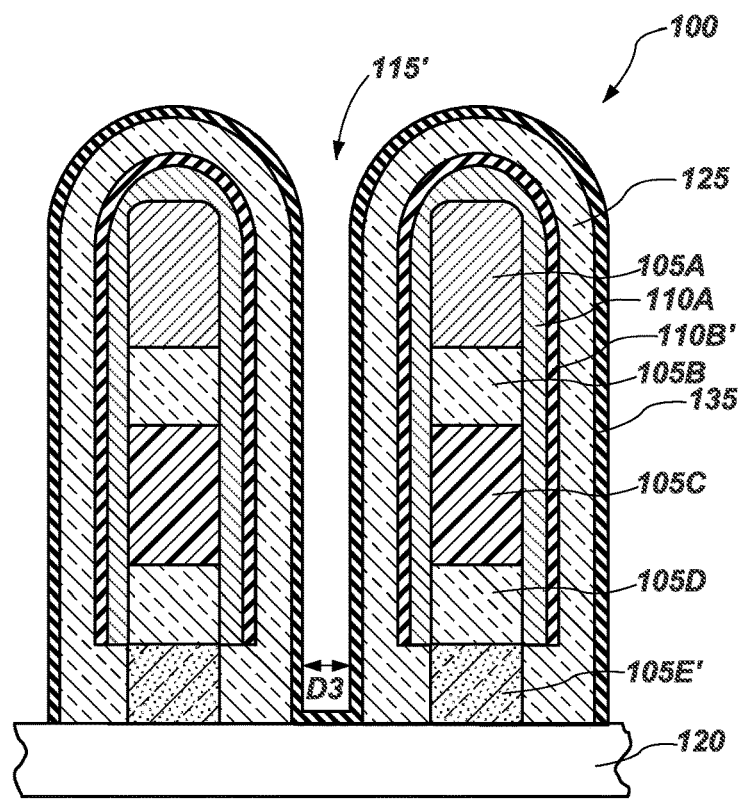
FIGS. 5-7 are cross-sectional views of stack structures including a liner containing a silicon carbide material and a seal including a silicon carbide material at various stages of forming the stack structures according to embodiments of the disclosure.

The silicon carbide material according to embodiments of the disclosure may also be used as a seal 125 in the stack structure 100, as shown in FIG. 5. The seal 125 may be formed adjacent to (e.g., over) the liner 110 of the stack structure 100. The silicon carbide material of the seal 125 may exhibit the same chemical composition or a different chemical composition as the silicon carbide material of the liner 110B. The seal 125 may substantially encapsulate the materials of the stacks 105 and remaining portions of the liner 110A, 110B. The silicon carbide material of the seal 125 may be selected to be selectively etchable relative to a conductive material subsequently formed over the stacks 105, a portion of which is removed by a later process act to form, for example, a bit line. The seal 125 may substantially surround (e.g., encapsulate) the stacks 105 and the liners 110A, 110B, such as over top surfaces and sidewalls thereof. The seal 125 may be present on three surfaces of the stacks 105, providing a hermetic barrier that prevents water from passing through the seal 125 and into the stacks 105. The seal 125 may directly contact the liner 110B, or may directly contact the stacks 105 if no liner 110A, 110B is present. Subsequent drawings illustrate the seal 125 in direct contact with the liner 110B. However, the seal 125 may directly contact the stacks 105 if a liner 110 is not present in the stack structure 100. While the seal 125 is illustrated in FIG. 5 as being a single material, the seal 125 may include multiple materials, such as a silicon nitride material and the silicon carbide material, with the silicon carbide material formed adjacent to (e.g., over) an initial portion of the seal 125 (e.g., the silicon nitride material).

The seal 125 according to embodiments of the disclosure may be formed by substantially the same radical CVD process described above for the liner 110B. However, the seal 125 may include the same amount of carbon, less carbon, or more carbon than the silicon carbide material of the liner 110B. The silicon carbon precursor and the hydrogen radicals may be sufficiently reactive with one another that plasma conditions are not used to form the seal 125. To form the seal 125, the stack structure 100 including the stacks 105 and liners 110A, 110B, if present, may be placed into a conventional reaction chamber and the silicon carbon precursor and the hydrogen radicals introduced into the reaction chamber as described above. The silicon carbide material of the seal 125 may be formed until the desired thickness of the seal 125 is achieved.

The seal 125 may be formed at a sufficient thickness to protect the materials 105A-105D of the stacks 105 and the liners 110A, 110B from subsequent process acts, which may oxidize or otherwise damage the materials of the stacks 105 if the materials were to remain exposed during the subsequent process acts. The thickness of the seal 125 is sufficient to provide barrier properties without forming so-called "bottlenecks," "pinch offs," or "bread-loafing" between adjacent stacks 105. The seal 125 may also provide protection during use and operation of the electronic device containing the seal 125, such as when high temperatures and electrical fields may be present. For instance, the carbon and/or chalcogenide materials of the stacks 105 may become oxidized or otherwise damaged when exposed to water or to process conditions used to form the stacks 105 or the liners 110A, 110B, such as during patterning of the conductive material 105E. The seal 125 may be formed at a minimum thickness sufficient to provide the desired barrier properties without forming bottlenecks or bread loafing around upper portions of the stacks 105 when the fill material 140 (see FIG. 6) is formed between the stacks 105. The thickness of the seal 125 may range from about 10 Å to about 266 Å. The silicon carbide material of the seal 125 may also be used as the fill material 140 by substantially completely filling the openings 115'.

The seal 125 may be conformally formed over the liner 110B and may form a substantially continuous material over sidewalls and the upper portion of the stacks 105. The seal 125 may be substantially free of pinholes or other discontinuities. The seal 125 may be formed in the openings 115, which are defined by the sidewalls of the liner 110B or by the sidewalls of the stacks 105 if no liner 110 is present. The seal 125 may be formed on (e.g., adjacent to) the stacks 105 or the liner 110B, reducing the size of the openings 115 to the openings 115'. After forming the seal 125, the stacks 105 are separated from one another by a distance D3, which is less than the distances D1 and D2. The distance D3 may be sufficient for the fill material 140 (see FIG. 6) to be formed in the openings 115' without voids forming in the fill material 140. The seal 125 may exhibit a high degree of conformality and a high degree of thickness uniformity (e.g., a high step coverage), reducing or eliminating bottlenecks and so-called "bread loafing" between the stacks 105. Since sufficient space remains between the stacks 105 after forming the seal 125, substantially no bottlenecks or bread loafing occur at or between the upper portions of the stacks 105. The seal 125 may exhibit a conformality of at least about 95%, such as greater than about 98% or greater than about 99%. The thickness coverage (e.g., a ratio of the thickness of the seal 125 on the sidewalls to the thickness of the seal 125 on the upper portions) of the seal 125 may be about 1:1.

The silicon carbide material of the seal 125 may be selected depending on an etch rate selectivity of the seal 125 compared to other exposed materials of the stack structure 100, such as the hardmask material or another conductive material, during later process acts. The carbon content of the seal 125 may be selected to exhibit a substantially similar etch rate to the other exposed materials to be removed during later process acts. The seal 125 is selected so that a portion of the seal 125 may be removed at a relatively fast etch rate with a high etch selectivity than other exposed materials. By increasing or decreasing the carbon content of the seal 125, the etch rate and etch rate selectivity of the seal 125 may be tailored. By way of example only, for a given dry etch chemistry and/or process conditions, the seal 125 may be etched at a faster etch rate if the silicon carbide material includes a higher amount of carbon than if the silicon carbide material includes a lower amount of carbon. For instance, the seal 125 and the hardmask material may exhibit similar etch rates and etch rate selectivities so that the seal 125 and the hardmask material may be removed substantially simultaneously during subsequent process acts. The silicon carbide material of the seal 125 may also provide etch resistance to a wet etch chemistry and/or process conditions used to clean the stack structures 100 before conducting subsequent process acts. For example, the silicon carbide material of the seal 125 may be substantially resistant to an aqueous hydrogen fluoride (HF) wet etch chemistry, such as that used to clean the stack structure 100.

Figure 6:
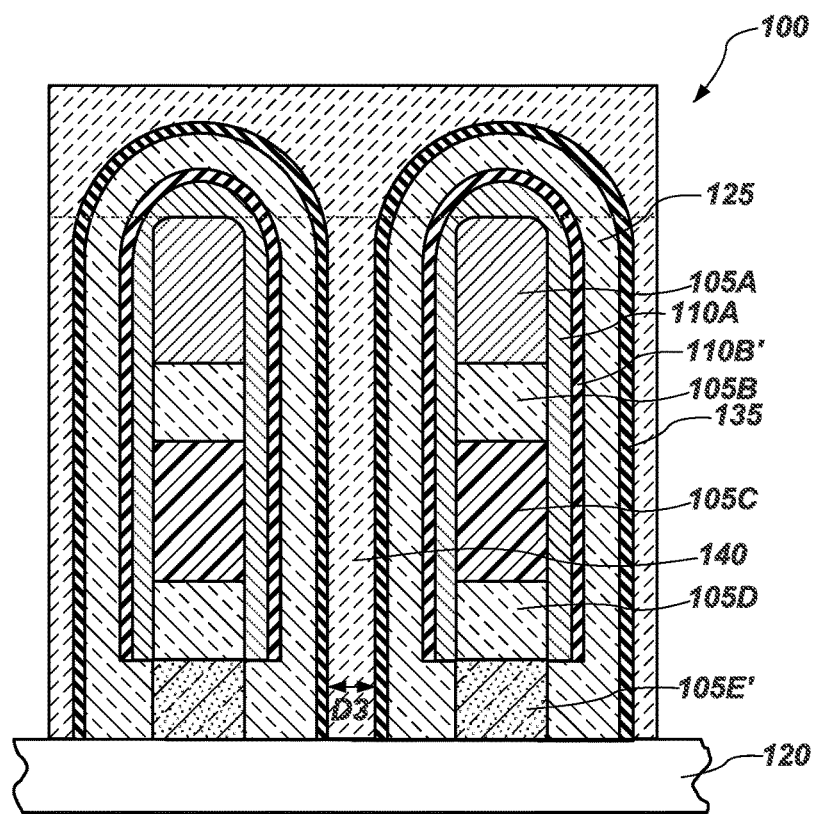
Figure 7:
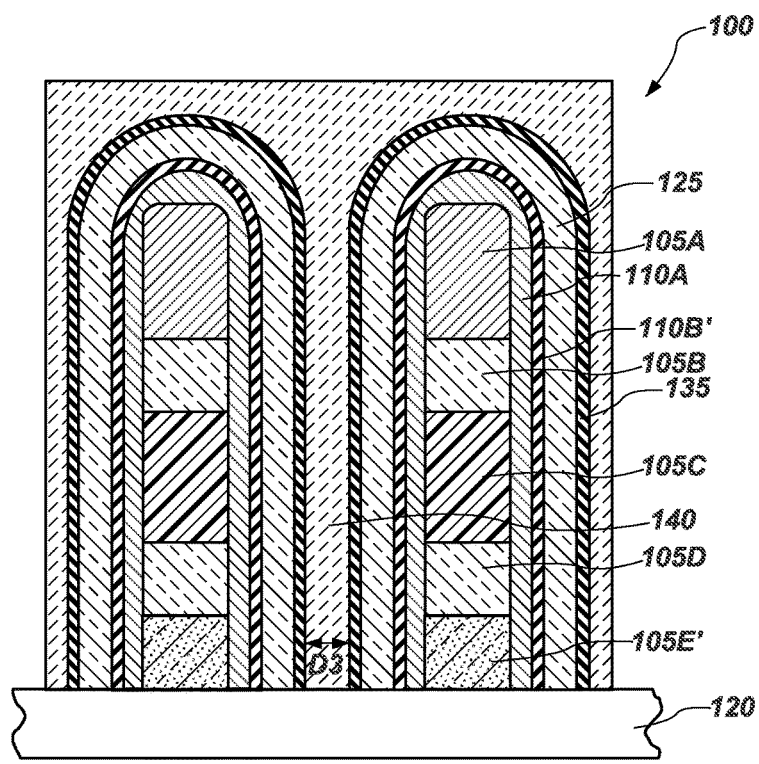

The fill material 140 may be formed in the openings 115' between the adjacent stacks 105, as shown in FIG. 6. The fill material 140 may, for example, be an electrically insulative material, such as a dielectric material. The fill material 140 may be a partially sacrificial material in that the fill material 140 is subsequently partially removed prior to completion of the electronic device that includes the stack structure 100. The fill material 140 may, for example, be partially removed prior to completion of a first deck of the electronic device. Alternatively, the fill material 140 may be present in the electronic device that includes the stack structure 100. The fill material 140 may, for example, be silicon dioxide, silicon nitride, silicon oxynitride, silicon oxycarbide, a spin-on dielectric material (SOD), BPSG, BSG, an air gap, or another dielectric material. The silicon carbide material according to embodiments of the disclosure may also be used as the fill material 140 such that the silicon carbide material substantially completely fills the openings 115'. In some embodiments, the fill material 140 is a spin-on dielectric material. In other embodiments, the fill material 140 is a high quality, silicon dioxide. Since the seal 125 according to embodiments of the disclosure does not produce bottlenecks or bread loafing, the fill material 140 may substantially completely fill the openings 115', as shown in FIG. 6. The openings 115' may be substantially completely filled without forming voids in the fill material 140. Excess fill material 140 over the stacks 105 may subsequently be removed, such as by chemical mechanical planarization (CMP). A portion of the seal 125 and an optional cap 135 may also be removed from upper surfaces of the stacks 105, exposing the hardmask material or an electrode material of the stacks 105, as shown by the dashed line in FIG. 6. However, the seal 125 and the cap 135 remain on the sidewalls of the stacks 105. If the fill material 140 is a dielectric material, the dielectric material may isolate memory cells of the electronic device from one another and may also provide mechanical support during subsequent process acts to form the electronic device.

The stack structure 100 may also include the optional cap 135 on an upper surface of the seal 125, as shown in FIG. 6. The cap 135 may be formed on the seal 125 in situ or ex situ. A thickness of the cap 135 relative to the thickness of the seal 125 is exaggerated in FIG. 6 for illustration purposes. The cap 135 may provide improved interface properties between the seal 125 and the subsequently formed fill material 140, enabling the fill material 140 to be formed in the openings 115' without forming voids. The cap 135 may, for example, be a high quality silicon oxide material. The cap 135 may be formed over the seal 125 by an ALD process, such as a conventional ALD process. The cap 135 may be highly conformal and exhibit a high degree of thickness uniformity.

The silicon carbide material of the seal 125 according to embodiments of the disclosure provides barrier properties to the stack structure 100, enabling the seal 125 to be formed without causing bread-loafing between adjacent stacks 105. Since less aggressive process conditions are used to form the seal 125, the formation of the seal 125 according to embodiments of the disclosure does not damage or otherwise affect materials of the stack 105, such as the chalcogenide material or carbon material, even when the seal 125 is formed directly on the materials of the stacks 105. Therefore, loss of the chalcogenide material may be substantially reduced or eliminated compared to the chalcogenide loss observed with conventional seal materials.

The stack structures 100 including the stacks 105, the silicon carbide material of the liner 110B and/or the seal 125, and the fill material 140 may be subjected to conventional, additional process acts to form the electronic device including the stack structures 100. By using the silicon carbide material of the liner 110B, the conductive material 105E may be selectively etched when exposed to a dry etch chemistry to pattern the conductive material 105E. In addition, the etch resistance of the silicon carbide material of the liner 110B and/or the seal 125 may be increased when exposed to a wet etch chemistry used to remove residues from the stack structures 100 before conducting additional process acts. The stack structures 100 including the stacks 105, the silicon carbide material of the liner 110B and/or the silicon carbide material of the seal 125 may also provide decreased parasitic capacitance to the electronic device including the stack structures 100.

Since the liner 110 and or the seal 125 includes the silicon carbide material instead of a conventional silicon oxide material, the silicon carbide material according to embodiments of the disclosure may provide one or more of etch selectivity, etch resistance, barrier properties, or chalcogenide loss to the electronic device containing the silicon carbide material. By forming the liner 110 and or the seal 125 including the silicon carbide material, loss of sensitive materials (e.g., chalcogenide materials, carbon materials) in the stacks is reduced. The liner 110 and or the seal 125 over the materials of the stack 105 may reduce redepositing of materials of the stack 105, which undesirably causes leakage. By including carbon in the silicon carbide material, the silicon carbide material provides etch selectivity relative to other exposed materials of the electronic device during fabrication of the electronic device. The etch selectivity of the silicon carbide material may be intermediate between that of silicon oxide and that of a high k dielectric material (from about 19 to about 20), such as aluminum oxide or hafnium oxide. As known in the art, using aluminum oxide or hafnium causes high spike current due to high capacitance. Using the silicon carbide material according to embodiments of the disclosure may decrease issues associated with high spike current and high capacitance. The silicon carbide material according to embodiments of the disclosure is selectively etchable by dry etch chemistries used to form than electronic device containing the silicon carbide material compared to conventional silicon oxide liner materials. The silicon carbide material according to embodiments of the disclosure is also more resistant to wet etch chemistries used to form than electronic device containing the silicon carbide material than conventional silicon oxide liner materials.

Figure 8:
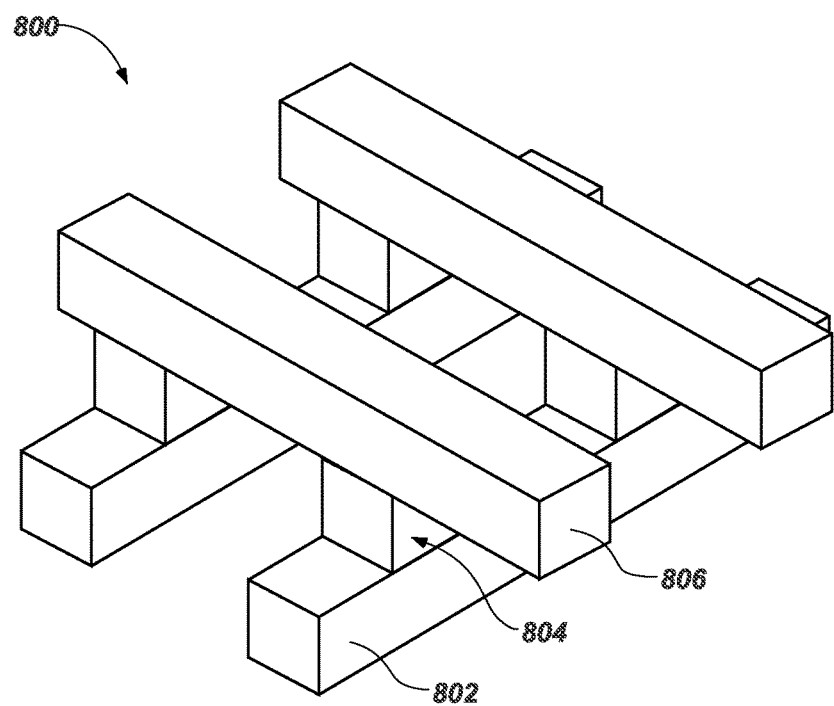
FIG. 8 is a perspective view of an array of memory cells including stack structures according to embodiments of the disclosure.

During subsequent process acts, the hardmask material of the stacks 105 may be removed by conventional techniques and another conductive material (e.g., electrically conductive material) formed over the remaining materials of the stacks 105. The another conductive material may be patterned by conventional techniques to form, for example, a bit line (e.g., a digit line) or contact over the stack structure 100. The another conductive material may directly contact the conductive material of the stacks 105, such as a conductive material configured as an electrode of the stacks 105. As shown in FIG. 8 and described below, the another conductive material may be configured as a bit line 806 (e.g., a digit line) of the electronic device that includes the stack structure 100. An array 800 may include multiple memory cells 804 arranged in rows and columns and that include the stack structure 100, with each memory cell 804 isolated (e.g., electrically isolated) from other memory cell 804 by the liner 110 and/or the seal 125 and the fill material 140 of the stack structure 100. The memory cells 804 including the stack structure 100 are positioned between access lines 802 (e.g., word lines) and bit lines 806 (e.g., digit lines).

Accordingly, an electronic device that comprises a stack structure comprising one or more stacks of materials and one or more silicon carbide materials is disclosed. The materials of the one or more stacks comprise a single chalcogenide material and one or more of a conductive carbon material, a conductive material, and a hardmask material. The one or more silicon carbide materials are adjacent to the one or more stacks of materials and comprise silicon carbide, silicon carboxide, silicon carbonitride, silicon carboxynitride, or silicon boronitrocarbide. The one or more silicon carbide materials also comprise silicon-carbon covalent bonds and the one or more silicon carbide materials are configured as a liner or as a seal.

Accordingly, a method of forming an electronic device is disclosed. The method comprises forming stacks of materials comprising one or more materials, the one or more materials of the stacks comprising a chalcogenide material. A silicon carbide material is formed by radical chemical vapor deposition and is adjacent to the stacks of materials. A fill material is formed adjacent to the silicon carbide material and between adjacent stacks of the stacks of materials. The fill material is substantially free of voids.

Accordingly, a method of forming an electronic device is disclosed. The method comprises forming stacks of materials comprising a chalcogenide material and one or more additional materials. Adjacent stacks of the stacks of materials are spaced apart by openings. A first silicon carbide material is conformally formed by radical chemical vapor deposition and is adjacent to the stacks of materials. A portion of the first silicon carbide material adjacent to a conductive material of the stacks of materials is removed and an exposed portion of the conductive material is removed through the openings. A second silicon carbide material is conformally formed by radical chemical vapor deposition. The second silicon carbide material is adjacent to the first silicon carbide material and in the openings. A fill material is formed between the adjacent stacks of the materials, the fill material substantially free of voids.

Figure 9:
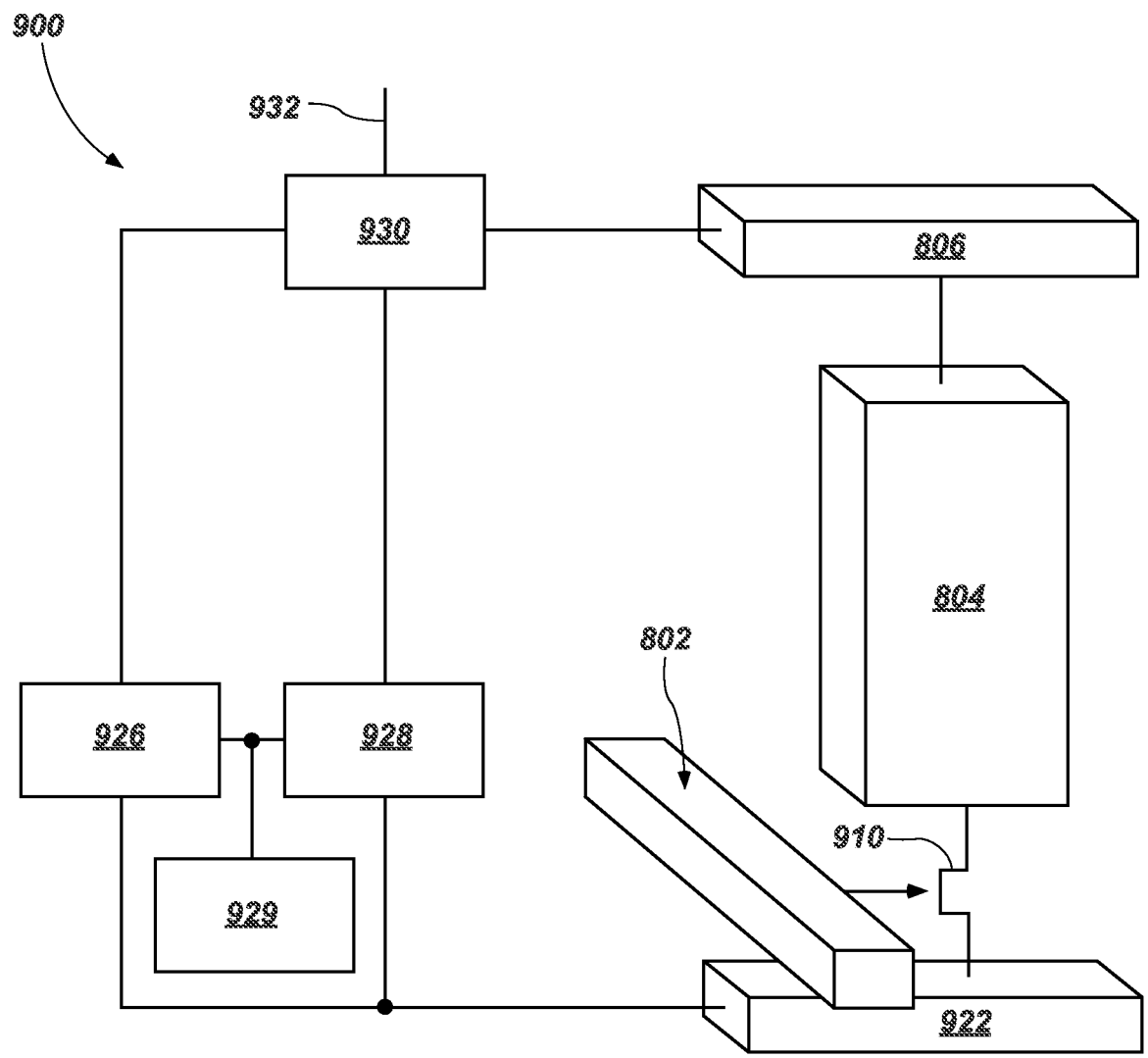
FIG. 9 is a functional block diagram of an electronic device including stack structures according to embodiments of the disclosure.

Additional processing acts may be conducted to form the electronic device 900 that includes the array 800 of memory cells 804, which include the stack structure 100 according to embodiments of the disclosure, as shown in FIG. 9. The subsequent process acts are conducted by conventional techniques, which are not described in detail herein. The memory cells 804 including the stack structure 100 are positioned between the access lines 802 (e.g., word lines) and the bit lines 806 (e.g., digit lines). The access lines 802 may be in electrical contact with, for example, the conductive material 105E (e.g., tungsten) of the stacks 105 or an electrode (e.g., a bottom electrode), and the bit lines 806 may be in electrical contact with another electrode (e.g., a top electrode) of the stacks 105. The bit lines 806 may directly overlie a row or column of the memory cells 804 including the stack structure 100 and contact the top electrode thereof. Each of the access lines 802 may extend in a first direction and may connect a row of the memory cells 804 (e.g., phase change memory cells). Each of the bit lines 806 may extend in a second direction that is at least substantially perpendicular to the first direction and may connect a column of the memory cells 804. A voltage applied to the access lines 802 and the bit lines 806 may be controlled such that an electric field may be selectively applied at an intersection of at least one access line 802 and at least one bit line 806, enabling the memory cells 804 including the stack structure 100 according to embodiments of the disclosure to be selectively operated. The electronic device 900 including the array 800 of memory cells 804 may include memory cells 804 containing one or more stacks of materials in which one or more of the materials is sensitive to oxidation, heat, etc. As discussed above, the sensitive material may include a chalcogenide material, a carbon material, etc. By way of example only, the electronic device may be a 3D electronic device, such as a 3D crosspoint memory device, a PCRAM memory device, or other memory device including one or more materials sensitive to oxidation and/or heat. The silicon carbide material according to embodiments of the disclosure may also be used in other electronic devices where protection of sensitive materials is desired, such as in a DRAM memory device.

Accordingly, an electronic device that comprises an array of memory cells is disclosed. The memory cells comprise stacks of materials comprising a chalcogenide material and one or more additional materials. One or more of the silicon carbide materials is adjacent to the stacks of materials, the one or more silicon carbide materials comprising silicon atoms and carbon atoms and the one or more silicon carbide materials comprising silicon-carbon covalent bonds.

An electronic device 900 (e.g., a PCRAM memory device) according to embodiments of the disclosure is shown schematically in the functional block diagram of FIG. 9. The electronic device 900 may include at least one memory cell 804 between at least one bit line 806 and at least one source line 922. The memory cell 804 may be substantially similar to the memory cell 804 described above with reference to FIG. 8. The memory cell 804 may be coupled to an access device 910. The access device 910 may act as a switch for enabling and disabling current flow through the memory cell 804. By way of non-limiting example, the access device 910 may be a transistor (e.g., a field-effect transistor, a bipolar junction transistor, etc.) with a gate connected to an access line, for example, the access line 802. The access line 802 may extend in a direction substantially perpendicular to that of the bit line 806. The bit line 806 and the source line 922 may be connected to logic for programming and reading the memory cell 804. A control multiplexer 930 may have an output connected to the bit line 806. The control multiplexer 930 may be controlled by a control logic line 932 to select between a first input connected to a pulse generator 926, and a second input connection to read-sensing logic 928.

During a programming operation, a voltage greater than a threshold voltage of the access device 910 may be applied to the access line 802 to turn on the access device 910. Turning on the access device 910 completes a circuit between the source line 922 and the bit line 806 by way of the memory cell 804. After turning on the access device 910, a bias generator 929 may establish, by way of the pulse generator 926, a bias voltage potential difference between the bit line 806 and the source line 922. During a read operation, the bias generator 929 may establish, by way of the read-sensing logic 928, a read bias voltage potential difference between the bit line 806 and the source line 922. The read bias voltage may be lower than the reset bias voltage. The read bias voltage enables current to flow through the memory cell 804. For example, for a given read bias voltage, if the chalcogenide material of the stacks 105 is in a high-resistance state (e.g., a reset state), a relatively smaller current flows through the memory cell 804 than if the chalcogenide material of the stacks 105 is in a low-resistance state (e.g., a set state). The amount of current flowing through the memory cell 804 during the read operation may be compared to a reference input by the read-sensing logic 928 (e.g., a sense amplifier) to discriminate whether the data stored in the memory cell 804 is a logic "1" or a logic "0." In some embodiments, the source line 922 may coincide with the access line 802 and the access device 910 may not be present. The pulse generator 926 and read-sensing logic 920 may bias the access line 802 at a voltage sufficient for the memory cell 804 to self-select.

Figure 10:
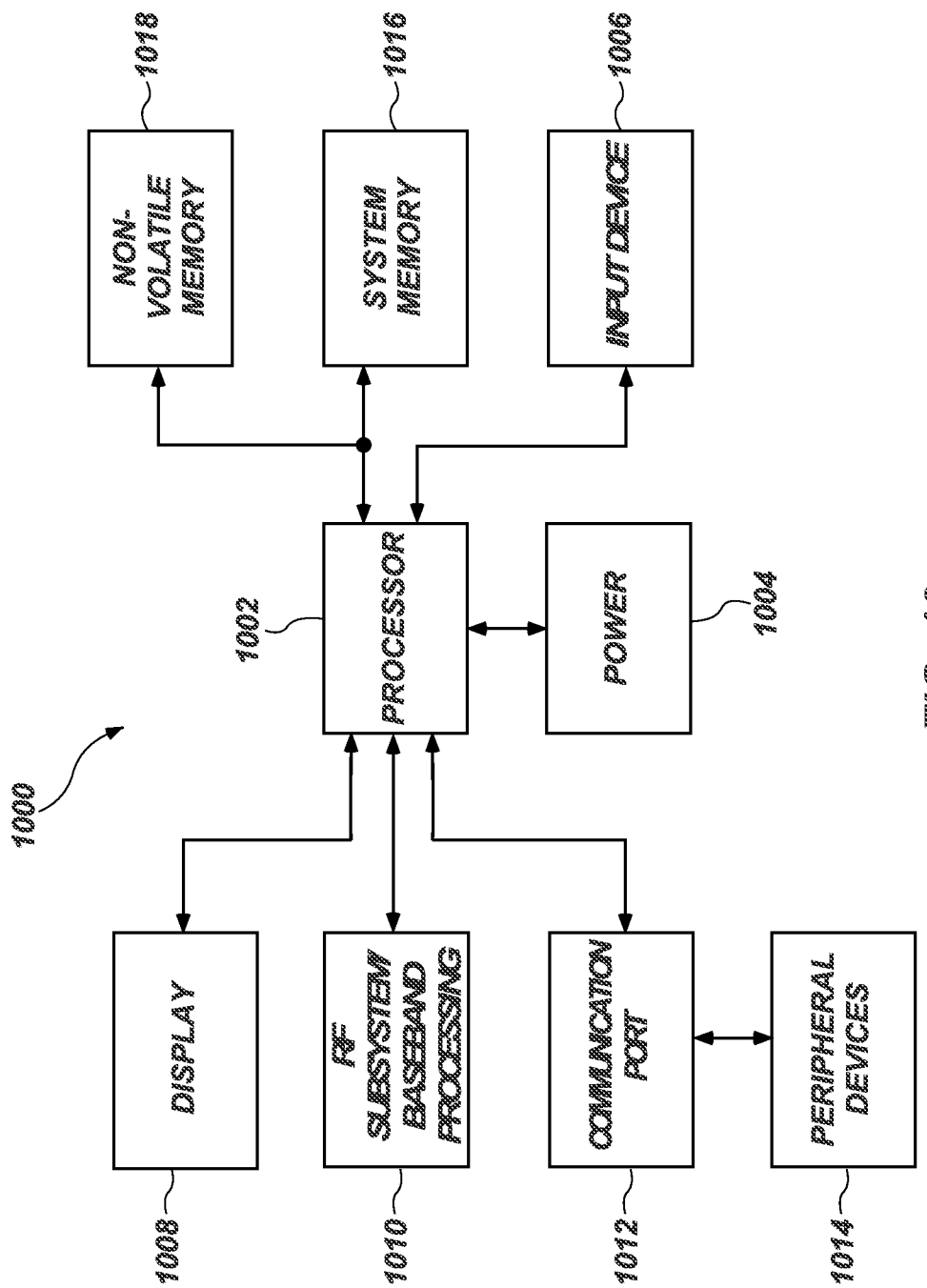
FIG. 10 is a simplified block diagram of a system including stack structures according to embodiments of the disclosure.

A system 1000 is also disclosed, as shown in FIG. 10, and includes the one or more memory cells 804 according to embodiments of the disclosure. FIG. 10 is a simplified block diagram of the system 1000 implemented according to one or more embodiments described herein. The system 1000 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The system 1000 includes at least one electronic device 900, which includes memory cells 804 including the stack structures 100 as previously described. The system 1000 may further include at least one processor 1002, such as a microprocessor, to control the processing of system functions and requests in the system 1000. The processor 1002 and other subcomponents of the system 1000 may include memory cells 804 according to embodiments of the disclosure. The processor 1002 may, optionally, include one or more electronic devices 900 as previously described.

The system 1000 may include a power supply 1004 in operable communication with the processor 1002. For example, if the system 1000 is a portable system, the power supply 1004 may include one or more of a fuel cell, a power scavenging device, permanent batteries, replaceable batteries, and rechargeable batteries. The power supply 1004 may also include an AC adapter. Therefore, the system 1000 may be plugged into a wall outlet, for example. The power supply 1004 may also include a DC adapter such that the system 1000 may be plugged into a vehicle cigarette lighter or a vehicle power port, for example.

Various other devices may be coupled to the processor 1002 depending on the functions that the system 1000 performs. For example, an input device 1006 may be coupled to the processor 1002. The input device 1006 may include input devices such as buttons, switches, a keyboard, a light pen, a mouse, a digitizer and stylus, a touch screen, a voice recognition system, a microphone, or a combination thereof. A display 1008 may also be coupled to the processor 1002. The display 1008 may include an LCD display, an SED display, a CRT display, a DLP display, a plasma display, an OLED display, an LED display, a three-dimensional projection, an audio display, or a combination thereof. Furthermore, an RF sub-system/baseband processor 1010 may also be coupled to the processor 1002. The RF sub-system/baseband processor 1010 may include an antenna that is coupled to an RF receiver and to an RF transmitter (not shown). A communication port 1012, or more than one communication port 1012, may also be coupled to the processor 1002. The communication port 1012 may be adapted to be coupled to one or more peripheral devices 1014, such as a modem, a printer, a computer, a scanner, or a camera, or to a network, such as a local area network, remote area network, intranet, or the Internet, for example.

The processor 1002 may control the system 1000 by implementing software programs stored in the memory. The software programs may include an operating system, database software, drafting software, word processing software, media editing software, or media playing software, for example. The memory is operably coupled to the processor 1002 to store and facilitate execution of various programs. For example, the processor 1002 may be coupled to system memory 1016, which may include phase change random access memory (PCRAM) and other known memory types. The system memory 1016 may include volatile memory, non-volatile memory, or a combination thereof. The system memory 1016 is typically large so that it can store dynamically loaded applications and data. In some embodiments, the system memory 1016 may include electronic devices, such as the electronic device 900 of FIG. 9, and memory cells, such as the memory cell 804 described above with reference to FIG. 8.

The processor 1002 may also be coupled to non-volatile memory 1018, which is not to suggest that system memory 1016 is necessarily volatile. The non-volatile memory 1018 may include PCRAM to be used in conjunction with the system memory 1016. The size of the non-volatile memory 1018 is typically selected to be just large enough to store any necessary operating system, application programs, and fixed data. Additionally, the non-volatile memory 1018 may include a high capacity memory such as disk drive memory, such as a hybrid-drive including resistive memory or other types of non-volatile solid-state memory, for example. The non-volatile memory 1018 may include electronic devices, such as the electronic device 900 of FIG. 9, and memory cells, such as the memory cell 804 described above with reference to FIG. 8.

Accordingly, a system comprising an input device, an output device, and a processor operably coupled to the input device and output device is disclosed. An electronic device is operably coupled to the processor and comprises memory cells that comprise stacks of materials comprising a single chalcogenide material and one or more additional materials. At least one silicon carbide material is vertically adjacent to the stacks of materials and on sidewalls of the single chalcogenide material. A thickness of the at least one silicon carbide material is substantially uniform along a length thereof.

The following examples serve to explain embodiments of the disclosure in more detail. These examples are not to be construed as being exhaustive or exclusive as to the scope of this disclosure.

EXAMPLES

Example 1

Ten samples of silicon carboxide materials exhibiting different carbon contents were formed by varying the amount of silicon-carbon precursor used to form the silicon carbide material and the amount of $O_2$ used in the plasma treatment act. The silicon carboxide materials were formed on blanket wafers. A ratio of the amount of silicon-carbon precursor to the amount of $O_2$ is shown in Table 1. The silicon-carbon precursor was a liquid precursor, octamethylcyclotetrasiloxane ($C_8H_{24}O_4Si_4$, molar mass 296.62, vapor pressure: about 124.5 Pa+/− about 6.2 Pa at 25° C.), and was commercially available from Sigma-Aldrich Corps (St. Louis, Mo.). The number of $O_2$ plasma treatment cycles (e.g., single and/or multiple deposition and treatment cycles) was also varied to determine the effect on the carbon content of the silicon carboxide materials.

TABLE 1

Conditions Used To Form Silicon Carboxide Materials

| Sample | Ratio of silicon-carbon precursor to $O_2$ | Number of $O_2$ plasma treatment cycles | Bulk Carbon (at. %) | Bulk Si/O (at. %) |
|---|---|---|---|---|
| 1 | 2.28 | X cycles | 16.0 | 38.7/45.2 |
| 2 | 4.00 | X cycles | 21.2 | 38.9/39.9 |
| 3 | 8.00 | X cycles | 25.6 | 39.3/35.1 |
| 4 | 7.00 | X cycles | 24.4 | 39.7/35.9 |
| 5 | 6.00 | X cycles | 23.7 | 39.6/36.7 |
| 6 | 2.28 | 2X cycles | 15.6 | 39.3/45.0 |
| 7 | 4.00 | 2X cycles | 20.1 | 40.0/39.0 |
| 8 | 8.00 | 2X cycles | 25.0 | 40.3/34.7 |
| 9 | 7.00 | 2X cycles | 24.0 | 40.5/35.4 |
| 10 | 6.00 | 2X cycles | 22.9 | 40.8/36.3 |

The remote hydrogen plasma was generated away from the surface of the wafers at an RF power ranging from about 200 W to about 2 kW. A remote plasma design with a so-called "downstream plasma" configuration using a Faraday Grid to filter out unwanted ions electrons, and unwanted UV radiation was used. The remote plasma design enabled only the desired free radicals and neutral species (e.g., the hydrogen radicals) to react with the silicon-carbon precursor to form the reaction product. The liquid silicon-carbon precursor was supplied from a bulk cabinet and introduced to a chamber containing the blanket wafers at a flow rate greater than or equal to about 50 ml/minute at a pressure of greater than or equal to about 20 psig (+/− about 10 psig), with additional push pressure imparted to the liquid delivery flow from inside the bulk cabinet. The introduction of the liquid silicon-carbon precursor occurred near or above the surface of the blanket wafers. Subsequent activation of the silicon-carbon precursor with hydrogen radicals, radical reactions, and $O_2$ plasma treatment produced silicon carboxide films.

Figure 11:
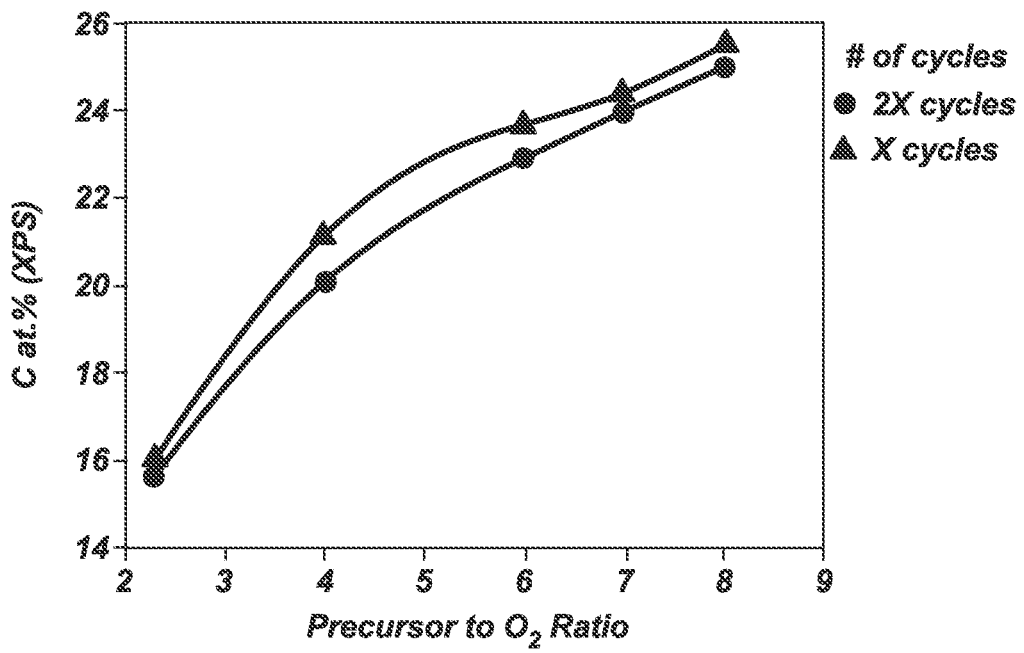
FIG. 11 is a graph showing carbon content of silicon carbide materials according to embodiments of the disclosure as a function of silicon-carbon precursor:$O_2$ ratio.
Figure 12:
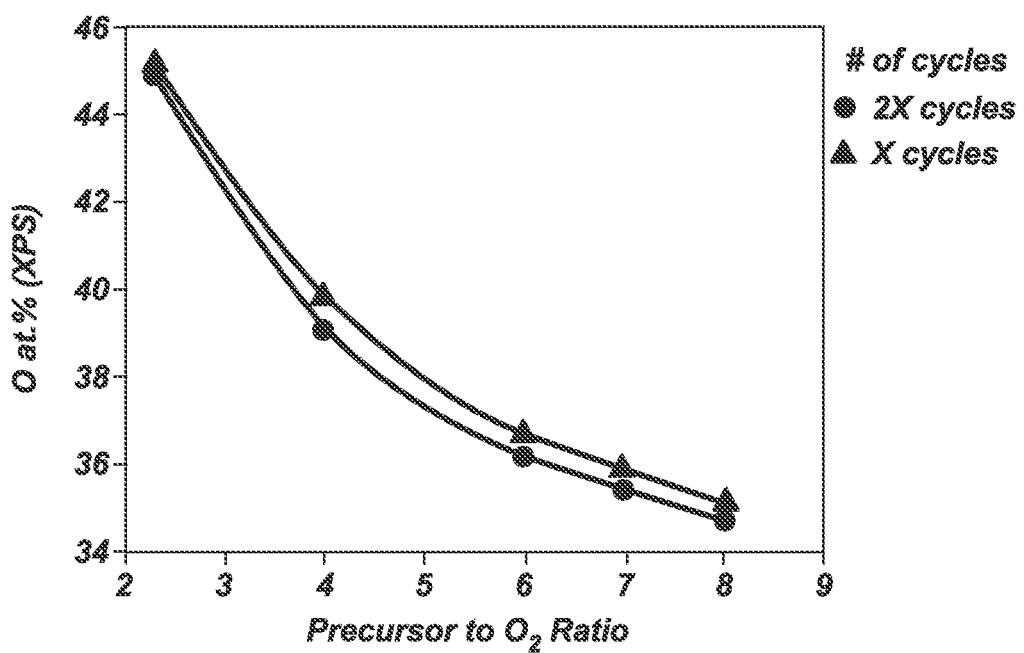
FIG. 12 is a graph showing oxygen content of silicon carbide materials according to embodiments of the disclosure as a function of silicon-carbon precursor:$O_2$ ratio.
Figure 13A:
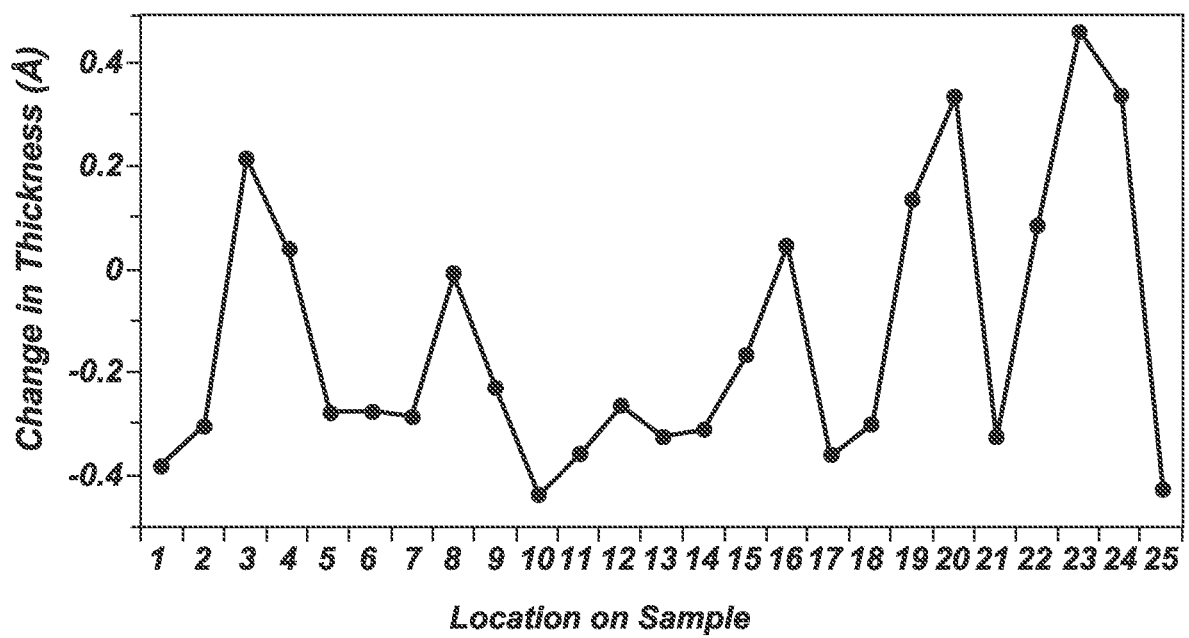
FIGS. 13A-13D are graphs showing wet etch rates of silicon carbide materials according to embodiments of the disclosure using 200:1 HF (FIGS. 13A and 13B), 100:1 HF (FIG. 13C), and 10:1 HF (FIG. 13D)
Figure 13B:
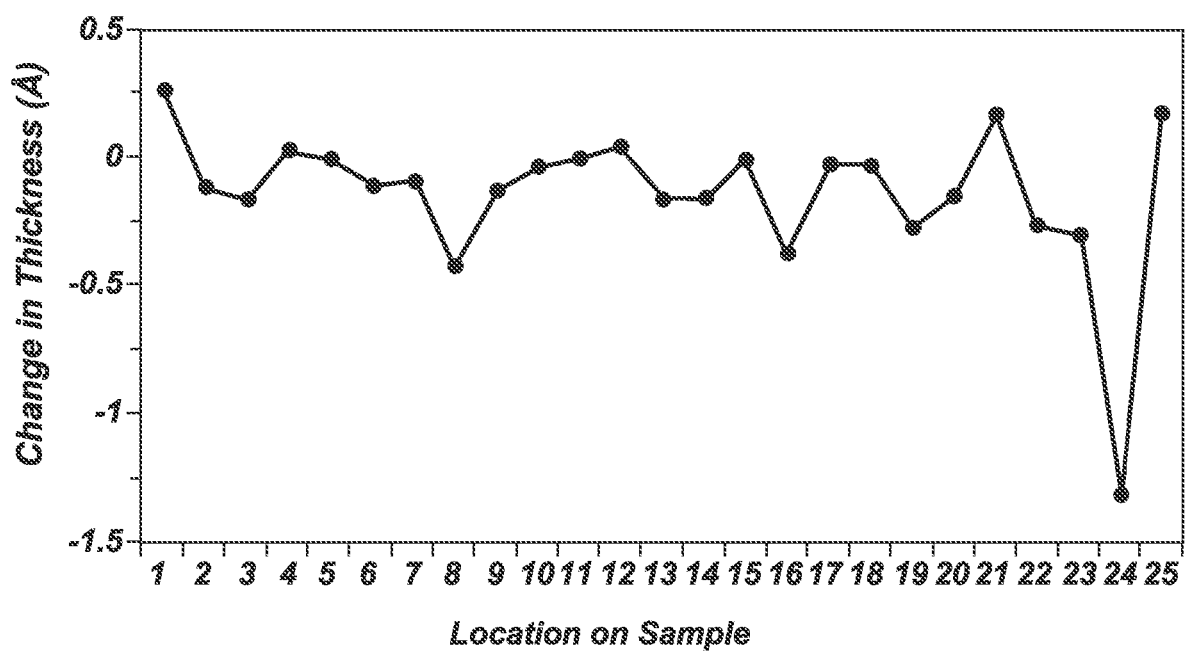
Figure 13C:
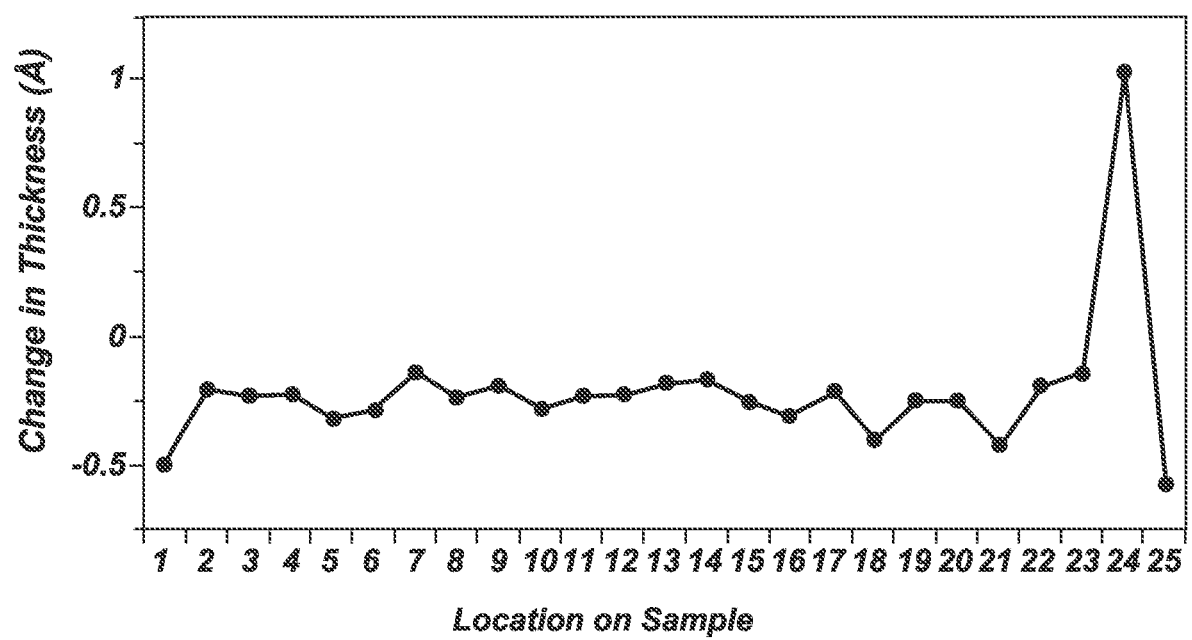
Figure 13D:
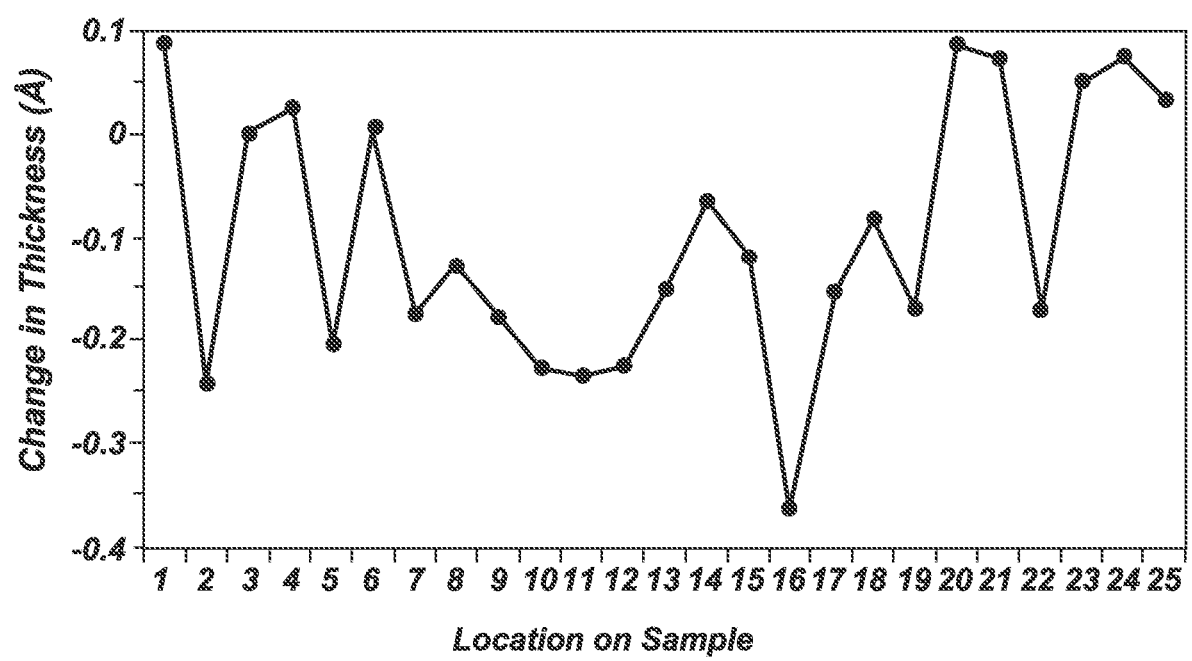

As shown in FIG. 11, silicon carbide materials including between 15 at. % and 26 at. % carbon were formed. The oxygen content of the silicon carbide materials is shown in FIG. 12, and ranged between about 34 at. % and 45 at. %.

Example 2

Wet etch rates in aqueous HF solutions of varying concentrations of one of the silicon carboxide materials of Example 1 were measured by conventional techniques. The silicon carboxide materials were formed on blanket wafers. The aqueous HF solutions included 200:1 HF, 100:1 HF, and 10:1 HF. As shown in FIGS. 13A-13D, substantially no etch (about 0 Å/min) of the silicon carbide material was observed, even with the most concentrated aqueous HF solution.

Example 3

Density, leakage density, and dielectric constants of the silicon carboxide materials (Samples 1-10 in Example 1) were calculated or measured by conventional techniques and are shown in Table 2. The silicon carboxide materials were formed on blanket wafers.

TABLE 2

Properties of Silicon Carboxide Materials

| Sample | Bulk density (g/cm$^3$) | Leakage density at 3 MV/cm (A/cm$^2$) | Dielectric constant |
|---|---|---|---|
| 1 | 1.9 | No data | k ≤ 4.5 |
| 2 | 1.8 | 4.62 × 10$^{-8}$ | k ≤ 4.5 |
| 3 | 1.8 | No data | k ≤ 4.5 |
| 4 | 1.9 | No data | k ≤ 4.5 |
| 5 | 1.9 | 4.83 × 10$^{-9}$ | k ≤ 4.5 |
| 6 | 2.0 | 2.00 × 10$^{-8}$ | k ≤ 4.5 |
| 7 | 2.0 | 8.30 × 10$^{-8}$ | k ≤ 4.5 |
| 8 | 2.0 | 1.36 × 10$^{-8}$ | k ≤ 4.5 |
| 9 | 2.0 | 5.50 × 10$^{-9}$ | k ≤ 4.5 |
| 10 | 2.0 | 6.51 × 10$^{-9}$ | k ≤ 4.5 |

As shown in Table 2, increasing the number of $O_2$ plasma treatment cycles increased the density of the silicon carboxide materials. The samples exposed to X number of cycles had a density between about 1.8 g/cm$^3$ and 1.9 g/cm$^3$, while the samples exposed to 2× number of cycles had a density of about 2.0 g/cm$^3$. The dielectric constants of the silicon carboxide materials were lower than the dielectric constant (about 8) of silicon nitride.

Example 4

Figure 14:
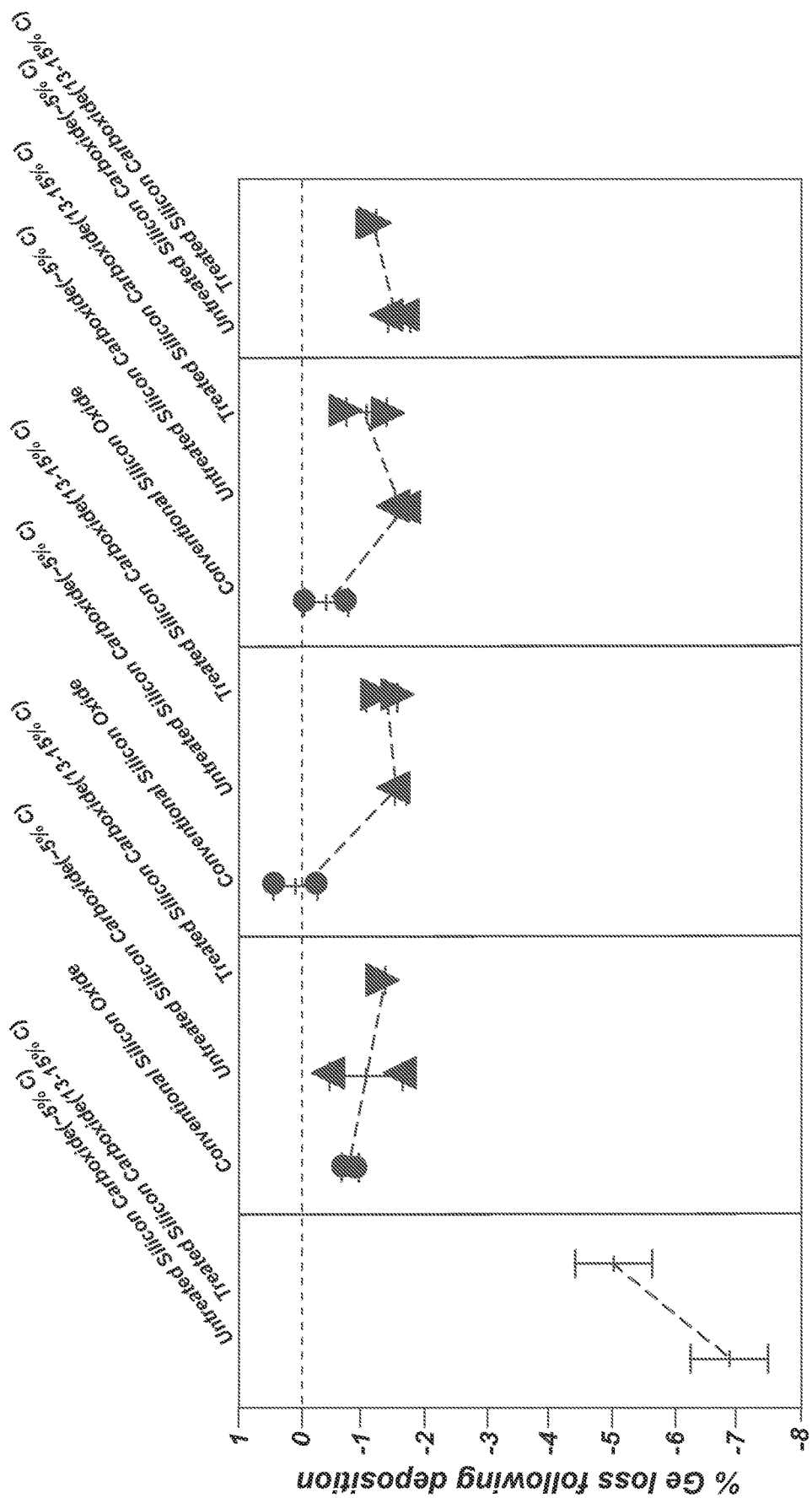
FIGS. 14 and 15 are graphs showing chalcogenide loss for silicon carbide materials according to embodiments of the disclosure.
Figure 15:
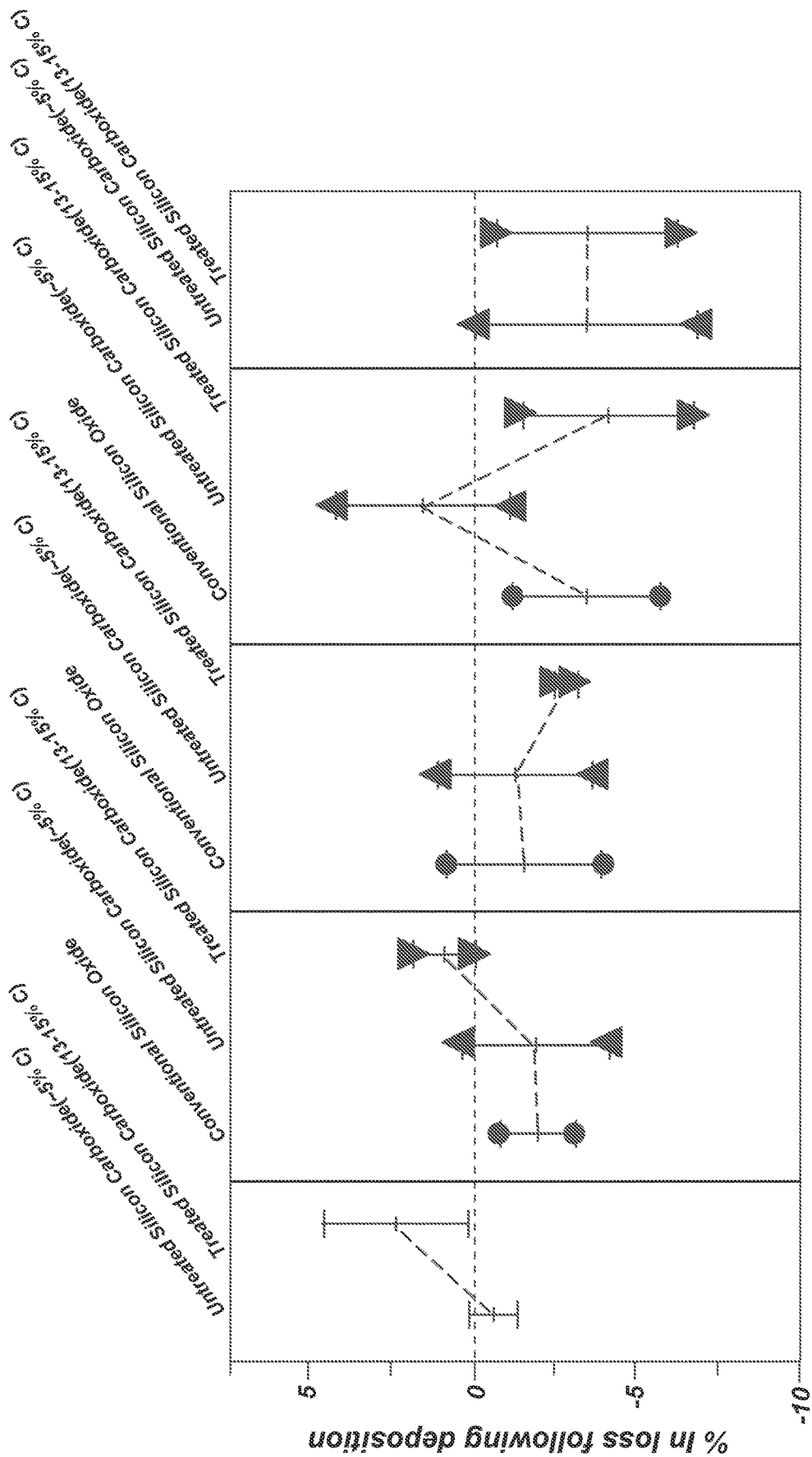

The extent of chalcogenide loss caused by forming the silicon carboxide materials over stacks including the chalcogenide material was determined by conventional techniques. The silicon carboxide materials were formed on sidewalls of the stacks. The stacks including the chalcogenide material were similar to the stacks illustrated schematically in FIG. 1 and were high aspect ratio stacks. The silicon carboxide materials included 5 at. % carbon, 13 at. % carbon, 14 at. % carbon, or 15 at. % carbon. As shown in FIG. 14, the percentage of germanium loss was comparable for forming the silicon carboxide material over the stack materials, forming the treated silicon carboxide material over the stack materials, and forming a conventional silicon oxide material over the stack materials. As shown in FIG. 15, the percentage of indium loss was less for forming the silicon carboxide material over the stack materials and forming the treated silicon carboxide material over the stack materials compared to forming a conventional silicon oxide material over the stack materials.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An electronic device comprising:
a stack structure comprising one or more stacks of materials, the materials of the one or more stacks comprising a single chalcogenide material and one or more of a conductive carbon material, a conductive material, and a hardmask material; and
one or more silicon carbide materials adjacent to the one or more stacks of materials, the one or more silicon carbide materials comprising silicon carboxide, silicon carbonitride, silicon carboxynitride, or silicon boronitrocarbide, the one or more silicon carbide materials comprising silicon-carbon covalent bonds, and the one or more silicon carbide materials configured as a liner or as a seal.

2. The electronic device of claim 1, wherein a first silicon carbide material of the one or more silicon carbide materials directly contacts a liner material adjacent to the stacks of materials.

3. The electronic device of claim 1, wherein a first silicon carbide material of the one or more silicon carbide materials directly contacts sidewalls of the stacks of materials.

4. The electronic device of claim 1, wherein a second silicon carbide material of the one or more silicon carbide materials directly contacts the first silicon carbide material.

5. The electronic device of claim 1, wherein a second silicon carbide material of the one or more silicon carbide materials directly contacts a seal material adjacent to the stacks of materials.

6. The electronic device of claim 1, wherein the one or more silicon carbide materials comprises a carbon content of from about 2 atomic percent (at. %) to about 50 at. % carbon.

7. The electronic device of claim 1, wherein the one or more silicon carbide materials comprises a homogeneous chemical composition.

8. The electronic device of claim 1, wherein the one or more silicon carbide materials comprises a gradient of carbon across a thickness of the one or more silicon carbide materials.

9. The electronic device of claim 1, wherein a chemical composition of the one or more silicon carbide materials configured as a liner comprises a different chemical composition as the one or more silicon carbide materials configured as a seal.

10. The electronic device of claim 1, wherein a chemical composition of the one or more silicon carbide materials configured as a liner comprises the same chemical composition as the one or more silicon carbide materials configured as a seal.

11. The electronic device of claim 1, wherein adjacent stacks are spaced at a half pitch of from about 10 nm to about 30 nm.

12. The electronic device of claim 1, further comprising a fill material in direct contact with the one or more silicon carbide materials.

13. The electronic device of claim 12, wherein the till material comprises an additional portion of the one or more silicon carbide materials.

14. An electronic device comprising:
an array of memory cells, the memory cells comprising:
stacks of materials comprising a chalcogenide material and one or more additional materials; and
one or more silicon carbide materials adjacent to the stacks of materials, the one or more silicon carbide materials comprising silicon atoms, carbon atoms, and atoms of at least one other chemical element, and the one or more silicon carbide materials comprising silicon-carbon covalent bonds; and
access lines and bit lines electrically coupled to the memory cells.

15. The electronic device of claim 14, wherein the stacks of materials comprise an aspect ratio of from about 10:1 to about 50:1.

16. The electronic device of claim 14, wherein the stacks of materials comprise a single chalcogenide material.

17. The electronic device of claim 1, wherein the chalcogenide material comprises indium.

18. The electronic device of claim 1, wherein the chalcogenide material comprises germanium.

19. The electronic device of claim 14, wherein the stacks of materials comprise a single chalcogenide material.

* * * * *

UNITED STATES PATENT AND TRADEMARK OFFICE
CERTIFICATE OF CORRECTION

| | |
|---|---|
| PATENT NO. | : 11,424,118 B2 |
| APPLICATION NO. | : 16/751049 |
| DATED | : August 23, 2022 |
| INVENTOR(S) | : Santanu Sarkar and Farrell M. Good |

It is certified that error appears in the above-identified patent and that said Letters Patent is hereby corrected as shown below:

In the Specification

Column 10, Line 48, change "(H')," to --(H),--

Column 12, Line 17, change "35 TOM" to --35 Torr.--

In the Claims

Claim 13, Column 26, Line 18, change "till" to --fill--

Signed and Sealed this
Twenty-eighth Day of February, 2023

Katherine Kelly Vidal
*Director of the United States Patent and Trademark Office*